(12) United States Patent
Fukuyo et al.

(10) Patent No.: US 7,749,867 B2
(45) Date of Patent: *Jul. 6, 2010

(54) METHOD OF CUTTING PROCESSED OBJECT

(75) Inventors: Fumitsugu Fukuyo, Hamamatsu (JP); Kenshi Fukumitsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 964 days.

This patent is subject to a terminal disclaimer.

(21) Appl. No.: 10/507,340

(22) PCT Filed: Mar. 11, 2003

(86) PCT No.: PCT/JP03/02867

§ 371 (c)(1), (2), (4) Date: Jun. 17, 2005

(87) PCT Pub. No.: WO03/076119

PCT Pub. Date: Sep. 18, 2003

(65) Prior Publication Data

US 2006/0011593 A1 Jan. 19, 2006

(30) Foreign Application Priority Data

Mar. 12, 2002 (JP) .............................. 2002-067372

(51) Int. Cl.
*H01L 21/301* (2006.01)
(52) U.S. Cl. .................. 438/463; 438/462; 438/460; 438/796; 438/795
(58) Field of Classification Search ......... 438/460–463, 438/795–798
See application file for complete search history.

(56) References Cited

U.S. PATENT DOCUMENTS 3,448,510 A 6/1969 Bippus et al.

(Continued)

FOREIGN PATENT DOCUMENTS

DE 196 46 332 A1 5/1998

(Continued)

OTHER PUBLICATIONS

F. Fukuyo, "The Stealth Dicing Technologies and Their Applications," Journal of Japan Laser Processing Society, vol. 12, No. 1, Feb. 2005, pp. 17-23, with English translation.

(Continued)

*Primary Examiner*—Dung A. Le
(74) *Attorney, Agent, or Firm*—Drinker Biddle & Reath LLP

(57) ABSTRACT

A method of cutting an object which can accurately cut the object is provided. An object to be processed 1 such as a silicon wafer is irradiated with laser light L while a light-converging point P is positioned therewithin, so as to form a modified region 7 due to multiphoton absorption within the object 1, and cause the modified region 7 to form a starting point region for cutting 8 shifted from the center line CL of the thickness of the object 1 toward the front face 3 of the object 1 along a line along which the object should be cut. Subsequently, the object 1 is pressed from the rear face 21 side thereof. This can generate a fracture from the starting point region for cutting 8 acting as a start point, thereby accurately cutting the object 1 along the line along which the object should be cut.

3 Claims, 21 Drawing Sheets

U.S. PATENT DOCUMENTS

| | | |
|---|---|---|
| 3,610,871 A | 10/1971 | Lumley |
| 3,626,141 A | 12/1971 | Daly |
| 3,790,051 A | 2/1974 | Moore |
| 3,790,744 A | 2/1974 | Bowen |
| 3,824,678 A | 7/1974 | Harris et al. |
| 3,970,819 A | 7/1976 | Gates et al. |
| 4,242,152 A | 12/1980 | Stone |
| 4,306,351 A | 12/1981 | Ohsaka et al. |
| 4,475,027 A | 10/1984 | Pressley |
| 4,531,060 A | 7/1985 | Suwa et al. |
| 4,562,333 A | 12/1985 | Taub et al. |
| 4,650,619 A | 3/1987 | Watanabe |
| 4,682,003 A | 7/1987 | Minakawa et al. |
| 4,769,310 A | 9/1988 | Gugger et al. |
| 4,814,575 A | 3/1989 | Petitbon |
| 4,899,126 A | 2/1990 | Yamada |
| 4,914,815 A | 4/1990 | Takada et al. |
| 4,981,525 A | 1/1991 | Kiyama et al. |
| 5,211,805 A | 5/1993 | Srinivasan |
| 5,230,184 A | 7/1993 | Bukhman |
| 5,251,003 A | 10/1993 | Vigouroux et al. |
| 5,254,149 A | 10/1993 | Hashemi et al. |
| 5,254,833 A | 10/1993 | Okiyama |
| 5,304,357 A | 4/1994 | Sato et al. |
| 5,382,770 A | 1/1995 | Black et al. |
| 5,543,365 A | 8/1996 | Wills et al. |
| 5,580,473 A | 12/1996 | Shinohara et al. |
| 5,609,284 A | 3/1997 | Kondratenko |
| 5,622,540 A | 4/1997 | Stevens |
| 5,637,244 A | 6/1997 | Erokhin |
| 5,641,416 A | 6/1997 | Chadha |
| 5,656,186 A | 8/1997 | Mourou et al. |
| 5,776,220 A | 7/1998 | Allaire et al. |
| 5,786,560 A | 7/1998 | Tatah et al. |
| 5,795,795 A | 8/1998 | Kousai et al. |
| 5,814,532 A | 9/1998 | Ichihara |
| 5,826,772 A | 10/1998 | Ariglio et al. |
| 5,841,543 A | 11/1998 | Guldi et al. |
| 5,882,956 A | 3/1999 | Umehara et al. |
| 5,925,271 A | 7/1999 | Polluck et al. |
| 5,968,382 A | 10/1999 | Matsumoto et al. |
| 5,976,392 A | 11/1999 | Chen |
| 6,031,201 A | 2/2000 | Amako et al. |
| 6,055,829 A | 5/2000 | Witzmann et al. |
| 6,121,118 A | 9/2000 | Jin et al. |
| 6,127,005 A | 10/2000 | Lehman et al. |
| 6,175,096 B1 | 1/2001 | Nielsen |
| 6,181,728 B1 | 1/2001 | Cordingley et al. |
| 6,187,088 B1 | 2/2001 | Okumura |
| 6,211,488 B1 | 4/2001 | Hoekstra et al. |
| 6,252,197 B1 | 6/2001 | Hoekstra et al. |
| 6,257,224 B1 | 7/2001 | Yoshino et al. |
| 6,259,058 B1 | 7/2001 | Hoekstra |
| 6,285,002 B1 | 9/2001 | Ngoi et al. |
| 6,322,958 B1 | 11/2001 | Hayashi |
| 6,325,855 B1 | 12/2001 | Sillmon et al. |
| 6,344,402 B1 | 2/2002 | Sekiya |
| 6,376,797 B1 | 4/2002 | Piwczyk et al. |
| 6,407,363 B2 | 6/2002 | Dunsky et al. |
| 6,420,678 B1 * | 7/2002 | Hoekstra ............... 219/121.75 |
| 6,489,588 B1 * | 12/2002 | Hoekstra et al. ....... 219/121.67 |
| 6,566,683 B1 | 5/2003 | Ogawa et al. |
| 6,726,631 B2 | 4/2004 | Hatangadi et al. |
| 6,744,009 B1 | 6/2004 | Xuan et al. |
| 6,770,544 B2 | 8/2004 | Sawada |
| 6,908,784 B1 | 6/2005 | Farnworth et al. |
| 6,992,026 B2 * | 1/2006 | Fukuyo et al. .............. 438/797 |
| 7,396,742 B2 * | 7/2008 | Fukuyo et al. .............. 438/463 |
| 7,547,613 B2 | 6/2009 | Fukuyo et al. |
| 7,566,635 B2 | 7/2009 | Yoshimaro et al. |
| 2001/0029673 A1 | 10/2001 | Brown et al. |
| 2001/0035401 A1 | 11/2001 | Manor |
| 2001/0046112 A1 | 11/2001 | Herchen |
| 2002/0006765 A1 | 1/2002 | Michel et al. |
| 2002/0096994 A1 | 7/2002 | Iwafuchi et al. |
| 2002/0115235 A1 | 8/2002 | Sawada |
| 2002/0158288 A1 | 10/2002 | Yamazaki et al. |
| 2002/0170896 A1 | 11/2002 | Choo et al. |
| 2003/0010275 A1 | 1/2003 | Radojevic et al. |
| 2003/0024909 A1 | 2/2003 | Hoekstra et al. |
| 2003/0141570 A1 | 7/2003 | Chen et al. |
| 2004/0002199 A1 | 1/2004 | Fukuyo et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0202596 A1 | 9/2005 | Fukuyo et al. |
| 2005/0272223 A1 | 12/2005 | Fujii et al. |
| 2006/0011593 A1 | 1/2006 | Fukuyo et al. |
| 2006/0040473 A1 | 2/2006 | Fukuyo et al. |
| 2006/0121697 A1 | 6/2006 | Fujii et al. |
| 2006/0148212 A1 | 7/2006 | Fukuyo et al. |
| 2006/0160331 A1 | 7/2006 | Fukuyo et al. |
| 2006/0255024 A1 | 11/2006 | Fukuyo et al. |
| 2007/0125757 A1 | 6/2007 | Fukuyo et al. |
| 2007/0158314 A1 | 7/2007 | Fukumitsu et al. |
| 2008/0090382 A1 | 4/2008 | Fujii et al. |

FOREIGN PATENT DOCUMENTS

| | | |
|---|---|---|
| EP | 0 863 231 | 9/1998 |
| EP | 1 026 735 A2 | 8/2000 |
| EP | 1338371 | 8/2003 |
| EP | 1 498 216 A1 | 1/2005 |
| EP | 1 580 800 A1 | 9/2005 |
| JP | 46-24989 | 7/1971 |
| JP | 48-12599 | 2/1973 |
| JP | 9-263734 | 7/1977 |
| JP | 53-033050 | 3/1978 |
| JP | 53-141573 | 12/1978 |
| JP | 56-76522 | 6/1981 |
| JP | 58-036939 | 3/1983 |
| JP | 58-57767 | 4/1983 |
| JP | 58-171783 | 10/1983 |
| JP | 59-130438 | 7/1984 |
| JP | 59-141233 | 8/1984 |
| JP | 60-55640 | 3/1985 |
| JP | 60-144985 | 7/1985 |
| JP | 60-167351 | 8/1985 |
| JP | 61-96439 | 5/1986 |
| JP | 61-112345 | 5/1986 |
| JP | 61-121453 | 9/1986 |
| JP | 61-220339 | 9/1986 |
| JP | 7-32281 | 5/1987 |
| JP | 62-004341 | 10/1987 |
| JP | 64-038209 | 2/1989 |
| JP | 1-112130 | 4/1989 |
| JP | 1-225509 | 9/1989 |
| JP | 1-225510 | 9/1989 |
| JP | 03-234043 | 10/1991 |
| JP | 3-276662 | 12/1991 |
| JP | 04-029352 | 1/1992 |
| JP | 04-111800 | 4/1992 |
| JP | 04-111800 A | 4/1992 |
| JP | 4-188847 | 7/1992 |
| JP | 4-300084 | 10/1992 |
| JP | 04-356942 | 12/1992 |
| JP | 05-335726 | 12/1993 |
| JP | 06-188310 | 7/1994 |
| JP | 07-037840 | 2/1995 |
| JP | 07-040336 A | 2/1995 |
| JP | 7-263382 | 10/1995 |
| JP | 7-308791 | 11/1995 |

| | | |
|---|---|---|
| JP | 8-148692 | 6/1996 |
| JP | 08-197271 | 8/1996 |
| JP | 8-264488 | 10/1996 |
| JP | 09-017756 | 1/1997 |
| JP | 9-17831 | 1/1997 |
| JP | 09-150286 | 6/1997 |
| JP | 9-260310 | 10/1997 |
| JP | 10-071483 | 3/1998 |
| JP | 10-163780 A | 6/1998 |
| JP | 10-214997 | 8/1998 |
| JP | 10-233373 | 9/1998 |
| JP | 10-305420 | 11/1998 |
| JP | 10-305420 A | 11/1998 |
| JP | 10-321908 | 12/1998 |
| JP | 11-071124 | 3/1999 |
| JP | 11-121517 | 4/1999 |
| JP | 11-138896 A | 5/1999 |
| JP | 11-156564 | 6/1999 |
| JP | 11-160667 | 6/1999 |
| JP | 11-162889 | 6/1999 |
| JP | 11-163097 | 6/1999 |
| JP | 11-163403 A | 6/1999 |
| JP | 11-177137 A | 7/1999 |
| JP | 11-177176 | 7/1999 |
| JP | 11-221684 A | 8/1999 |
| JP | 11-267861 A | 10/1999 |
| JP | 2000-015467 A | 1/2000 |
| JP | 2000-042764 | 2/2000 |
| JP | 2000-104040 | 4/2000 |
| JP | 2000-124537 | 4/2000 |
| JP | 2000-124537 A | 4/2000 |
| JP | 2000-158156 | 6/2000 |
| JP | 2000-195828 | 7/2000 |
| JP | 2000-210785 | 8/2000 |
| JP | 2000-216114 | 8/2000 |
| JP | 2000-219528 A | 8/2000 |
| JP | 2000-237885 | 9/2000 |
| JP | 2000-237886 | 9/2000 |
| JP | 2001-047264 | 2/2001 |
| JP | 2001-085736 | 3/2001 |
| JP | 2001-127015 | 5/2001 |
| JP | 2001-196282 | 7/2001 |
| JP | 2001-250798 | 9/2001 |
| JP | 2001-326194 | 11/2001 |
| JP | 2001-345252 | 12/2001 |
| JP | 2002-026443 | 1/2002 |
| JP | 2002-047025 | 2/2002 |
| JP | 2002-050589 | 2/2002 |
| JP | 2002-158276 | 5/2002 |
| JP | 2002-192367 | 7/2002 |
| JP | 2002-192368 | 7/2002 |
| JP | 2002-192370 | 7/2002 |
| JP | 2002-192371 | 7/2002 |
| JP | 2002-205180 | 7/2002 |
| JP | 2002-205181 | 7/2002 |
| JP | 2002-224878 | 8/2002 |
| JP | 2002-226796 | 8/2002 |
| JP | 2002-192369 | 10/2002 |
| JP | 2003-001458 | 1/2003 |
| JP | 2003-17790 | 1/2003 |
| JP | 2003-39184 | 2/2003 |
| JP | 2003-46177 | 2/2003 |
| JP | 2003-154517 | 5/2003 |
| JP | 2003-334812 | 11/2003 |
| JP | 2003-338467 | 11/2003 |
| JP | 2003-338468 | 11/2003 |
| JP | 2003-338636 | 11/2003 |
| JP | 2005-001001 | 1/2005 |
| JP | 2005-047290 | 2/2005 |
| JP | 2005-159378 | 6/2005 |
| JP | 2005-159379 | 6/2005 |
| JP | 2005-313237 | 11/2005 |
| JP | 2006-128723 | 5/2006 |
| JP | 2006-135355 | 5/2006 |
| KR | 2001-017690 | 8/1999 |
| TW | 165354 | 8/1991 |
| TW | 192484 | 10/1992 |
| TW | 219906 | 2/1994 |
| TW | 415036 | 12/2000 |
| WO | WO 01/90709 A1 | 11/2001 |
| WO | WO 02/07927 A1 | 1/2002 |
| WO | WO 02/22301 | 3/2002 |
| WO | WO 03/076118 A1 | 9/2003 |
| WO | WO 2004/082006 A1 | 9/2004 |

OTHER PUBLICATIONS

R. Sugiura et al., "The Stealth Dicing Technologies and Their Applications," Proceedings of the 63$^{rd}$ Laser Materials Processing Conference, May 2005, pp. 115-123, with English abstract.

A. Ishii et al., CO2 Laser Processing Technology, Nikkan Kogyo Publishing Production, Dec. 21, 1992, pp. 63-65 (with partial English translation).

Journal of the Japan Society of Griding Engineers, vol. 47, No. 5, May 2003, pp. 229-231, English translation.

The 6$^{th}$ International Symposium on Laser Precision Microfabrication, Apr. 2005, Symposium Program and Technical Digest, including F. Fukuyo et al., "Stealth Dicing Technologies and Their Applications," English abstract.

T. Yajima et al., *New Version Laser Handbook*, published by Asakura Shoten, Jun. 15, 1989, pp. 666-669.

*Tooling Machine Series, Laser Machining*, published by Taiga Shuppan, Inc., Sep. 10, 1990, pp. 91-96.

*Electronic Material*, No. 9, on 2002, published by Kogyo Chousakai, pp. 17-21.

F. Fukuyo et al., "Stealth Dicing Technology for Ultra Thin Wafer", presented at 2003 ICEP (International Conference on Electronics Packaging), Apr. 16-18, 2003, Tokyo, Japan.

K. Hayashi, "Inner Glass Marking by Harmonics of Solid-state Laser," Proceedings of 45th Laser Materials Processing Conference, Dec. 1998, pp. 23-28.

T. Sano et al., "Evaluation of Processing Characteristics of Silicon With Picosecond Pulse Laser," Preprints of the National Meeting of Japan Welding Society, No. 66, Apr. 2000, pp. 72-73.

K. Miura et al., "Formation of Photo-induced Structures in Glasses with Femtosecond Laser," Proceedings of 42nd Laser Materials Processing Conference, Nov. 1997, pp. 105-111.

T. Miyazaki, "Laser Beam Machining Technology," Published by Sangyo-Tosho Inc., May 31, 1991, First Edition, pp. 9-10.

K. Midorikawa, "Femto-byo Laser no Genjo to Kako Oye", Dai 45 Kai Laser-netsu Kako Kenkyukai Ronbunshu, Dec. 1998, ISBN 4-947684-21-6, 3.4 Local Machining by Nonlinear Effect, 5.4 Modifying Transparent Material.

U.S. Appl. No. 12/461,969 to Fukuyo et al., filed Aug. 31, 2009.
U.S. Appl. No. 12/570,380 to Fukuyo et al., filed Sep. 30, 2009.

\* cited by examiner

METHOD OF CUTTING PROCESSED OBJECT

TECHNICAL FIELD.

The present invention relates to a method of cutting an object to be processed for cutting an object to be processed such as a semiconductor material substrate, a piezoelectric substrate, and a glass substrate.

BACKGROUND ART

One of laser applications is cutting. The following is typical cutting by laser. For example, a part to cut in an object to be processed such as a semiconductor wafer or glass substrate is irradiated with laser light having a wavelength absorbed by the object, and melting by heating is advanced by the laser light absorption from the front face to rear face of the object in the part to cut, so as to cut the object. However, this method also melts the surroundings of a region which becomes a part to cut in the front face of the object. As a consequence, in the case where the object to be processed is a semiconductor wafer, there is a fear of semiconductor devices positioned near the above-mentioned region among those formed on the front face of the semiconductor wafer melting.

Examples of methods of preventing the front face of such an object to be processed from melting include laser cutting methods disclosed in Japanese Patent Application Laid-Open Nos. 2000-219528 and 2000-15467. The cutting methods of these publications cause laser light to heat a part to cut in the object to be processed, and then cool the object, so as to generate a thermal shock at the part to cut in the object, thereby cutting the object.

DISCLOSURE OF THE INVENTION

When the thermal shock generated in the object to be processed is large in the cutting methods in these publications, however, unnecessary fractures such as those deviating from the line along which the object should be cut or those extending to a part not irradiated with laser may occur in the front face of the object. Therefore, these cutting methods cannot perform precision cutting. When the object to be processed is a semiconductor wafer, a glass substrate formed with a liquid crystal display unit or a glass substrate formed with an electrode pattern in particular, semiconductor chips, the liquid crystal display unit, and electrode pattern may be damaged by the unnecessary fractures. Since an average input energy is large in these cutting methods, they impart a large thermal damage to the semiconductor chips and the like.

In view of such circumstances, it is an object of the present invention to provide a method of cutting an object to be processed which can accurately cut the object.

For achieving the above-mentioned object, the method of cutting an object to be processed in accordance with the present invention comprises a starting point region for cutting forming step of irradiating a wafer-like object to be processed with laser light while positioning a light-converging point therewithin, so as to form a modified region due to multiphoton absorption within the object, and causing the modified region to form a starting point region for cutting, deviated from a center position of the object in a thickness direction thereof toward one end face of the object, along a line along which the object should be cut in the object; and a pressing step of pressing the object from the other end face side of the object.

In this method of cutting an object to be processed, the modified region formed by multiphoton absorption forms a starting point region for cutting within the object along a desirable line along which the object should be cut for cutting the object. Here, the multiphoton absorption occurs locally within the object, so that laser light is hardly absorbed by one end face of the object and the other end face on the opposite side thereof, whereby one end face and the other end face can be prevented from melting upon laser light irradiation. Since the starting point region for cutting is formed so as to deviate from the center position of the object in the thickness direction thereof toward one end face, when the object is pressed from the other end face side, a fracture can be generated in the object from the starting point region for cutting acting as a start point with a pressing force smaller than that in the case where the starting point region for cutting is formed at the center position. This can prevent unnecessary fractures deviated from the line along which the object should be cut from occurring, and accurately cut the object along the line along which the object should be cut.

Here, the light-converging point refers to a location at which laser light is converged. The starting point region for cutting refers to a region to become a start point for cutting when the object to be processed is cut. Therefore, the starting point region for cutting is a part to cut where cutting is to be performed in the object. The starting point region for cutting may be produced by continuously forming a modified region or intermittently forming a modified region. The expression "form a starting point region for cutting deviated from a center position of the object in a thickness direction thereof toward one end face of the object" means that a modified region constituting the starting point region for cutting is formed so as to deviate from the half thickness position of the object in the thickness direction thereof toward one end face. Namely, it means that the center position of the width of the modified region (starting point region for cutting) in the thickness direction of the object is positioned so as to deviate from the center position of the object in the thickness direction toward one end face, and is not limited to the case where the whole modified region (starting point region for cutting) is positioned on the one end face side of the center position of the object in the thickness direction.

Preferably, the pressing step presses the object along the line along which the object should be cut. When cutting an object to be processed into functional devices in the case where the functional devices are formed like a matrix as a laminate part on the other end face of the object, for example, the object can accurately be cut into the functional devices if a line along which the object should be cut is set between neighboring functional devices and the object is pressed along this line along which the object should be cut. Also, this can substantially eliminate the action of the pressing force on the functional devices.

Preferably, positional data of the line along which the object should be cut with respect to the object to cut is stored in the starting point region for cutting forming step, and the object is pressed along the line along which the object should be cut according to the positional data in the pressing step. This makes it possible for the pressing force to act easily and accurately on the starting point region for cutting formed within the object.

BEST MODES FOR CARRYING OUT THE INVENTION

In the following, a preferred embodiment of the present invention will be explained with reference to drawings. In the starting point region for cutting forming step of the method of cutting an object to be processed in accordance with this embodiment, the object is irradiated with laser light while a light-converging point is positioned therewithin, so as to form a modified region due to multiphoton absorption within the object. Therefore, the laser processing method, multiphoton absorption in particular, will be explained at first.

A material becomes optically transparent if its absorption bandgap $E_G$ is greater than a photon energy hv. Hence, the condition under which absorption occurs in the material is $hv>E_G$. However, even when optically transparent, the material yields absorption under the condition of $nhv>E_G$ (n=2, 3, 4, . . . ) if the intensity of laser light is very high. This phenomenon is known as multiphoton absorption. In the case of pulse waves, the intensity of laser light is determined by the peak power density ($W/cm^2$) of laser light at a light-converging point thereof. The multiphoton absorption occurs, for example, at a peak power density ($W/cm^2$) of $1\times10^8$ ($W/cm^2$) or higher. The peak power density is determined by (energy per pulse of laser light at the light-converging point)/(laser light beam spot cross-sectional area×pulse width). In the case of a continuous wave, the intensity of laser light is determined by the electric field strength ($W/cm^2$) of laser light at the light-converging point.

Figure 1:
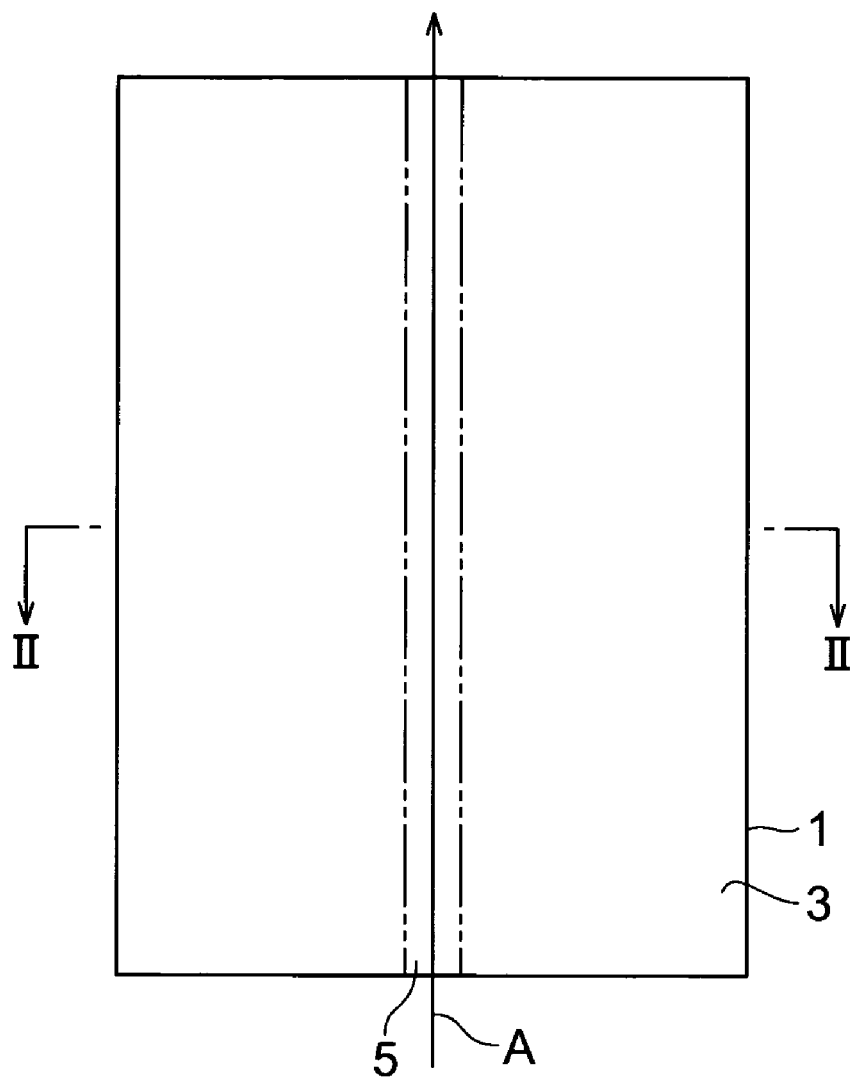
FIG. 1 is a plan view of an object to be processed during laser processing in the laser processing method in accordance with an embodiment of the present invention.
Figure 2:
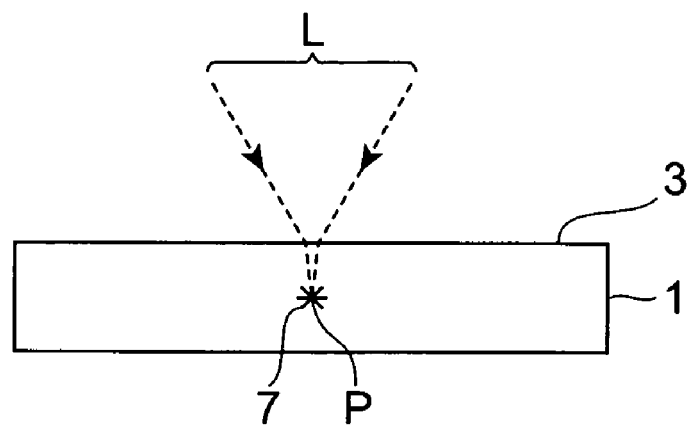
FIG. 2 is a sectional view of the object to be processed taken along the line II-II of FIG. 1.
Figure 3:
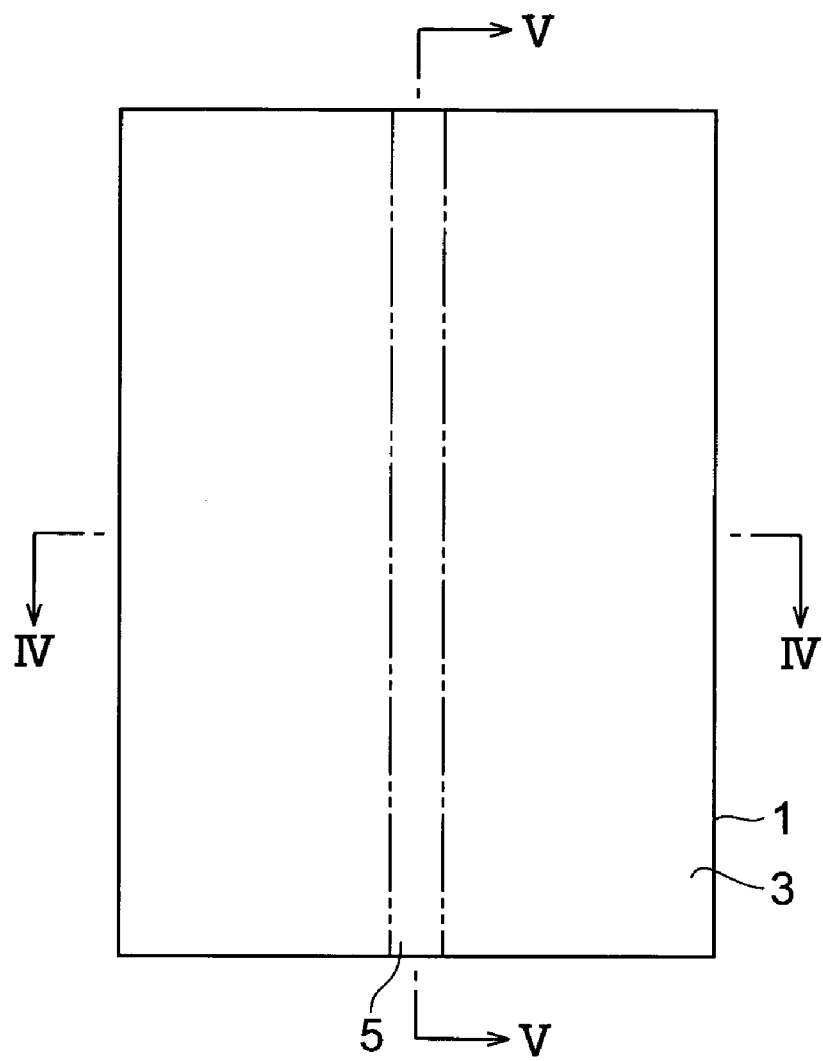
FIG. 3 is a plan view of the object to be processed after laser processing by the laser processing method in accordance with the embodiment.
Figure 4:
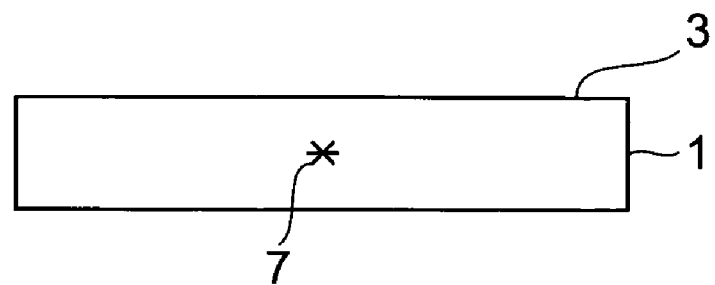
FIG. 4 is a sectional view of the object to be processed taken along the line IV-IV of FIG. 3.
Figure 5:
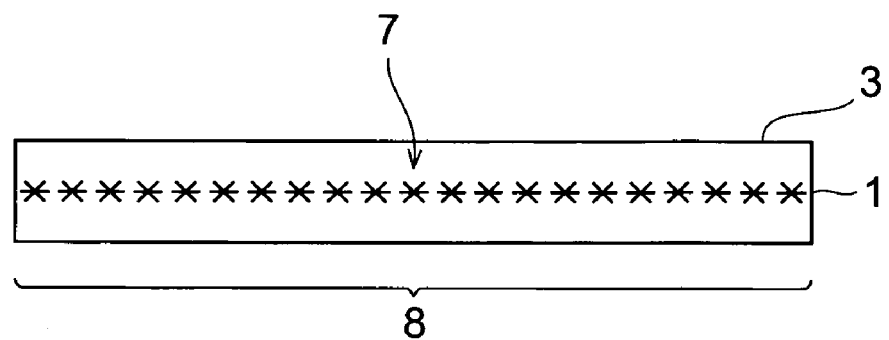
FIG. 5 is a sectional view of the object to be processed taken along the line V-V of FIG. 3.

The principle of laser processing in accordance with the embodiment utilizing such multiphoton absorption will now be explained with reference to FIGS. 1 to 6. FIG. 1 is a plan view of an object to be processed 1 during laser processing; FIG. 2 is a sectional view of the object 1 taken along the line II-II of FIG. 1; FIG. 3 is a plan view of the object 1 after laser processing; FIG. 4 is a sectional view of the object 1 taken along the line IV-IV of FIG. 3; FIG. 5 is a sectional view of the object 1 taken along the line V-V of FIG. 3; and FIG. 6 is a plan view of the cut object 1.

As shown in FIGS. 1 and 2, the front face 3 of the object 1 has a desirable line along which the object should be cut 5 for cutting the object 1. The line along which the object should be cut 5 is a linearly extending virtual line (the object 1 may also be formed with an actual line acting as the line along which the object should be cut 5). In the laser processing in accordance with this embodiment, the object 1 is irradiated with laser light L such that a light-converging point P is positioned within the object 1 under a condition causing multiphoton absorption, so as to form a modified region 7. Here, the light-converging point is a location where the laser light L is converged.

The laser light L is relatively moved along the line along which the object should be cut 5 (in the direction of arrow A), so as to move the light-converging point P along the line along which the object should be cut 5. This forms the modified region 7 along the line along which the object should be cut 5 only within the object 1 as shown in FIGS. 3 to 5, and the modified region 7 forms a starting point region for cutting (part to cut) 8. In the laser processing method in accordance with this embodiment, no modified region 7 is formed upon heating the object 1 by causing the object 1 to absorb the laser light L. Instead, the laser light L is transmitted through the object 1, so as to generate multiphoton absorption within the object 1, thereby forming the modified region 7. Hence, the laser light L is hardly absorbed by the front face 3 of the object 1, whereby the front face 3 of the object 1 does not melt.

Figure 6:
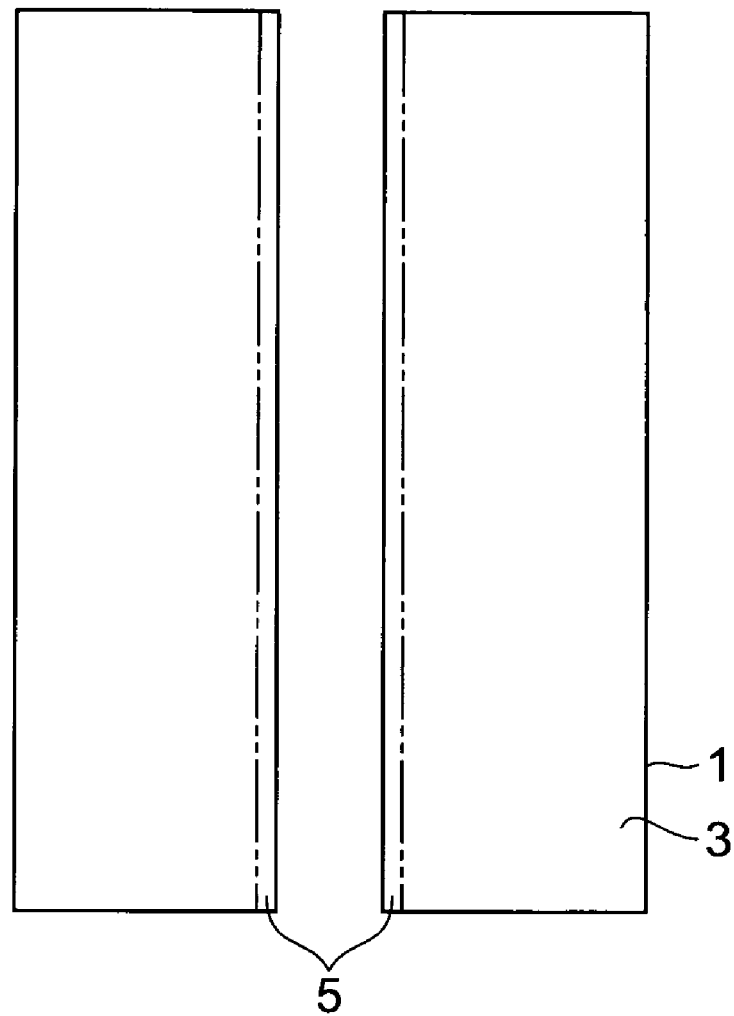
FIG. 6 is a plan view of the object to be processed cut by the laser processing method in accordance with the embodiment.

If a start point exists at a location to cut when cutting the object 1, the object 1 fractures from this start point and thus can be cut with a relatively small force as shown in FIG. 6. This makes it possible to cut the object 1 without generating unnecessary fractures in the front face 3 of the object 1.

There seem to be the following two ways of cutting the object from the starting point region for cutting acting as a start point. The first case is where, after forming the starting point region for cutting, an artificial force is applied to the object, so that the object fractures from the starting point region for cutting acting as a start point, whereby the object is cut. This is the cutting in the case where the object has a large thickness, for example. The application of an artificial force encompasses application of bending stress and shearing stress along the starting point region for cutting of the object, and exertion of a temperature difference upon the object to generate thermal stress, for example. The other case is where a starting point region for cutting is formed, so that the object is naturally fractured in a cross-sectional direction (thickness direction) of the object from the starting point region for cutting acting as a start point, whereby the object is cut. This is enabled, for example, by forming the starting point region for cutting by a single row of modified regions when the object has a small thickness, and by a plurality of rows of modified regions aligned in the thickness direction when the object has a large thickness. Even in the case of natural fracturing, fractures do not extend to the front face at a location not formed with the starting point region for cutting in the part to cut, whereby only the part corresponding to the location formed with the starting point region for cutting can be fractured. Thus, fracturing can be regulated well. Such a fracturing method with favorable controllability is quite effective, since objects to be processed such as silicon wafers have recently been apt to become thinner.

The modified region formed by multiphoton absorption in this embodiment includes the following cases (1) to (3):

(1) Case where the Modified Region is a Crack Region Including One or a Plurality of Cracks An object to be processed (e.g., glass or a piezoelectric material made of $LiTaO_3$) is irradiated with laser light while a light-converging point is positioned therewithin under a condition with an electric field intensity of at least $1\times10^8$ (W/cm$^2$) at the light-converging point and a pulse width of 1 μs or less. This pulse width is a condition under which a crack region can be formed only within the object while generating multiphoton absorption without causing unnecessary damages to the object. This generates a phenomenon of optical damage due to multiphoton absorption within the object. This optical damage induces thermal distortion within the object, thereby forming a crack region therewithin. The upper limit of electric field intensity is $1\times10^{12}$ (W/cm$^2$), for example. The pulse width is preferably 1 ns to 200 ns, for example. The forming of a crack region due to multiphoton absorption is described, for example, in "Internal Marking of Glass Substrate by Solid-state Laser Harmonics", *Proceedings of 45th Laser Materials Processing Conference* (December 1998), pp. 23-28.

The inventors determined relationships between the electric field intensity and the magnitude of crack by an experiment. Conditions for the experiment are as follows:

(A) Object to be processed: Pyrex (registered trademark) glass (having a thickness of 700 μm)
(B) Laser
Light source: semiconductor laser pumping Nd:YAG laser
Wavelength: 1064 nm
Laser light spot cross-sectional area: $3.14\times10^{-8}$ cm$^2$
Oscillation mode: Q-switch pulse
Repetition frequency: 100 kHz
Pulse width: 30 ns
Output: output<1 mJ/pulse
Laser light quality: $TEM_{00}$
Polarization characteristic: linear polarization
(C) Light-converging lens
Transmittance with respect to laser light wavelength: 60%
(D) Moving speed of a mounting table mounting the object: 100 mm/sec Here, the laser light quality being $TEM_{00}$ indicates that the light convergence is so high that light can be converged up to about the wavelength of laser light.

Figure 7:
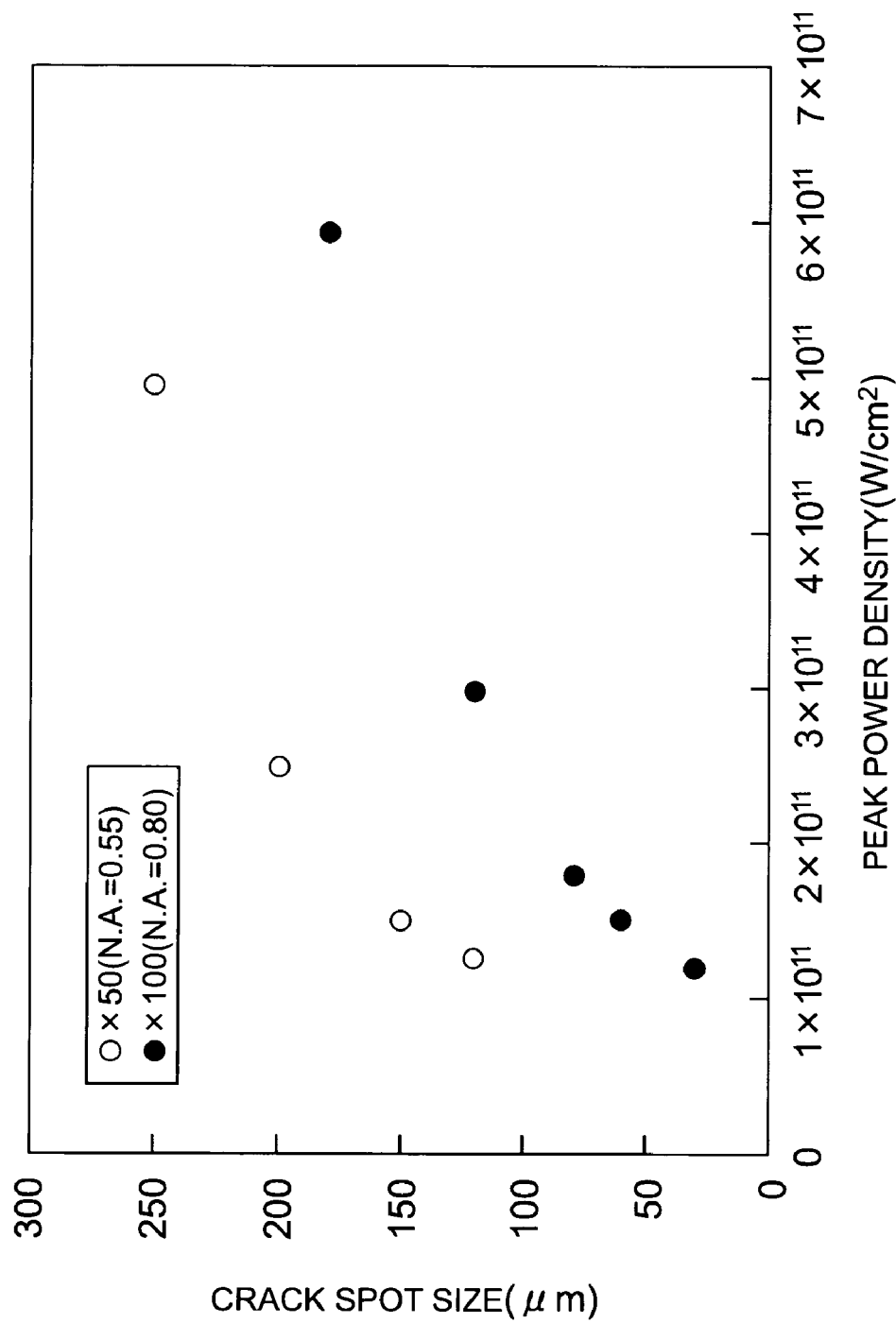
FIG. 7 is a graph showing relationships between the electric field intensity and crack spot size in the laser processing method in accordance with the embodiment.

FIG. 7 is a graph showing the results of the above-mentioned experiment. The abscissa indicates peak power density. Since laser light is pulse laser light, its electric field intensity is represented by the peak power density. The ordinate indicates the size of a crack part (crack spot) formed within the object processed by one pulse of laser light. Crack spots gather, so as to form a crack region. The size of a crack spot refers to that of the part of dimensions of the crack spot yielding the maximum length. The data indicated by black circles in the graph refers to a case where the light-converging lens (C) has a magnification of ×100 and a numerical aperture (NA) of 0.80. On the other hand, the data indicated by white circles in the graph refers to a case where the light-converging lens (C) has a magnification of ×50 and a numerical aperture (NA) of 0.55. It is seen that crack spots begin to occur within the object when the peak power density reaches about $10^{11}$ (W/cm$^2$), and become greater as the peak power density increases.

Figure 8:
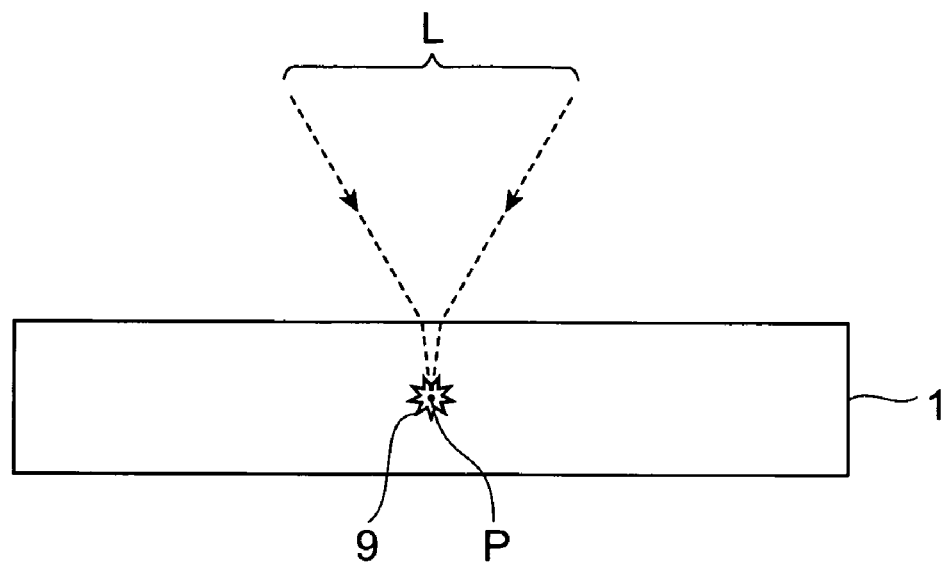
FIG. 8 is a sectional view of the object to be processed in a first step of the laser processing method in accordance with the embodiment.
Figure 9:
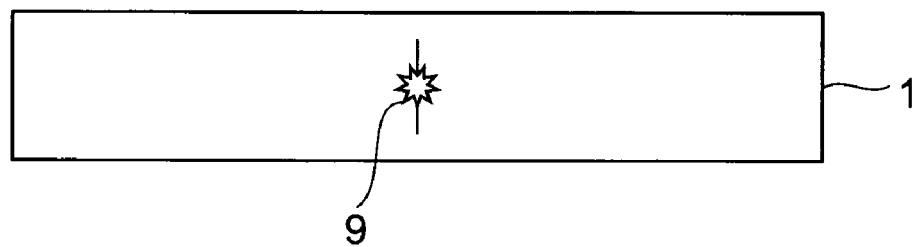
FIG. 9 is a sectional view of the object to be processed in a second step of the laser processing method in accordance with the embodiment.
Figure 10:
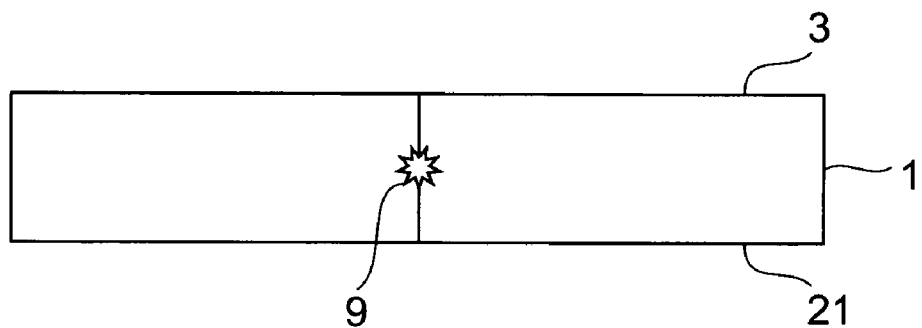
FIG. 10 is a sectional view of the object to be processed in a third step of the laser processing method in accordance with the embodiment.
Figure 11:
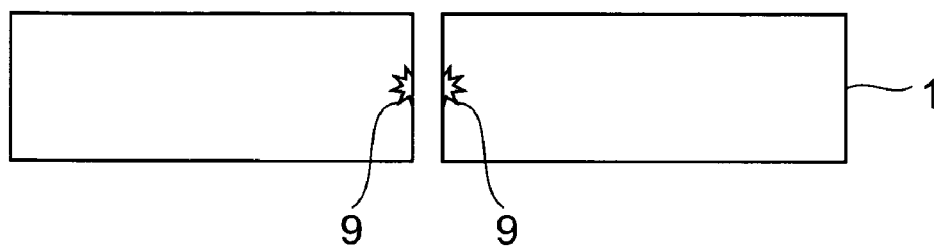
FIG. 11 is a sectional view of the object to be processed in a fourth step of the laser processing method in accordance with the embodiment.

A mechanism by which the object to be processed is cut upon formation of a crack region in the laser processing in accordance with this embodiment will now be explained with reference to FIGS. 8 to 11. As shown in FIG. 8, the object 1 is irradiated with laser light L while positioning the light-converging point P within the object 1 under a condition where multiphoton absorption occurs, so as to form a crack region 9 therewithin along a line along which the object should be cut. The crack region 9 is a region including one or a plurality of crack spots. The crack region 9 forms a starting point region for cutting. As shown in FIG. 9, the crack further grows while using the crack region 9 as a start point (i.e., using the starting point region for cutting as a start point). As shown in FIG. 10, the crack reaches the front face 3 and rear face 21 of the object 1. As shown in FIG. 11, the object 1 breaks, so as to be cut. The crack reaching the front face and rear face of the object may grow naturally or grow as a force is applied to the object.

(2) Case where the modified region is a Molten processed region

An object to be processed (e.g., a semiconductor material such as silicon) is irradiated with laser light while a light-converging point is positioned therewithin under a condition with an electric field intensity of at least $1\times10^8$ (W/cm$^2$) at the light-converging point and a pulse width of 1 μs or less. As a consequence, the inside of the object is locally heated by multiphoton absorption. This heating forms a molten processed region within the object. The molten processed region refers to a region once melted and then re-solidified, a region just in a melted state, or a region in the process of re-solidifying from its melted state, and may also be defined as a phase-changed region or a region having changed its crystal structure. The molten processed region may also be regarded as a region in which a certain structure has changed into another structure in monocrystal, amorphous, and polycrystal structures. Namely, it refers to a region in which a monocrystal structure has changed into an amorphous structure, a region in which a monocrystal structure has changed into a polycrystal structure, and a region in which a monocrystal structure has changed into a structure including an amorphous structure and a polycrystal structure, for example. When the object is a silicon monocrystal structure, the molten processed region is an amorphous silicon structure, for example. The upper limit of electric field intensity is $1 \times 10^{12}$ (W/cm$^2$), for example. The pulse width is preferably 1 ns to 200 ns, for example.

By an experiment, the inventors have verified that a molten processed region is formed within a silicon wafer. Conditions for the experiment are as follows:

(A) Object to be processed: silicon wafer (having a thickness of 350 μm and an outer diameter of 4 inches)

(B) Laser
   Light source: semiconductor laser pumping Nd:YAG laser
   Wavelength: 1064 nm
   Laser light spot cross-sectional area: $3.14 \times 10^{-8}$ cm$^2$
   Oscillation mode: Q-switch pulse
   Repetition frequency: 100 kHz
   Pulse width: 30 ns
   Output: 20 μJ/pulse
   Laser light quality: TEM$_{00}$
   Polarization characteristic: linear polarization (C) Light-converging lens
   Magnification: ×50
   N. A.: 0.55
   Transmittance with respect to laser light wavelength: 60%

(D) Moving speed of a mounting table mounting the object: 100 mm/sec

Figure 12:
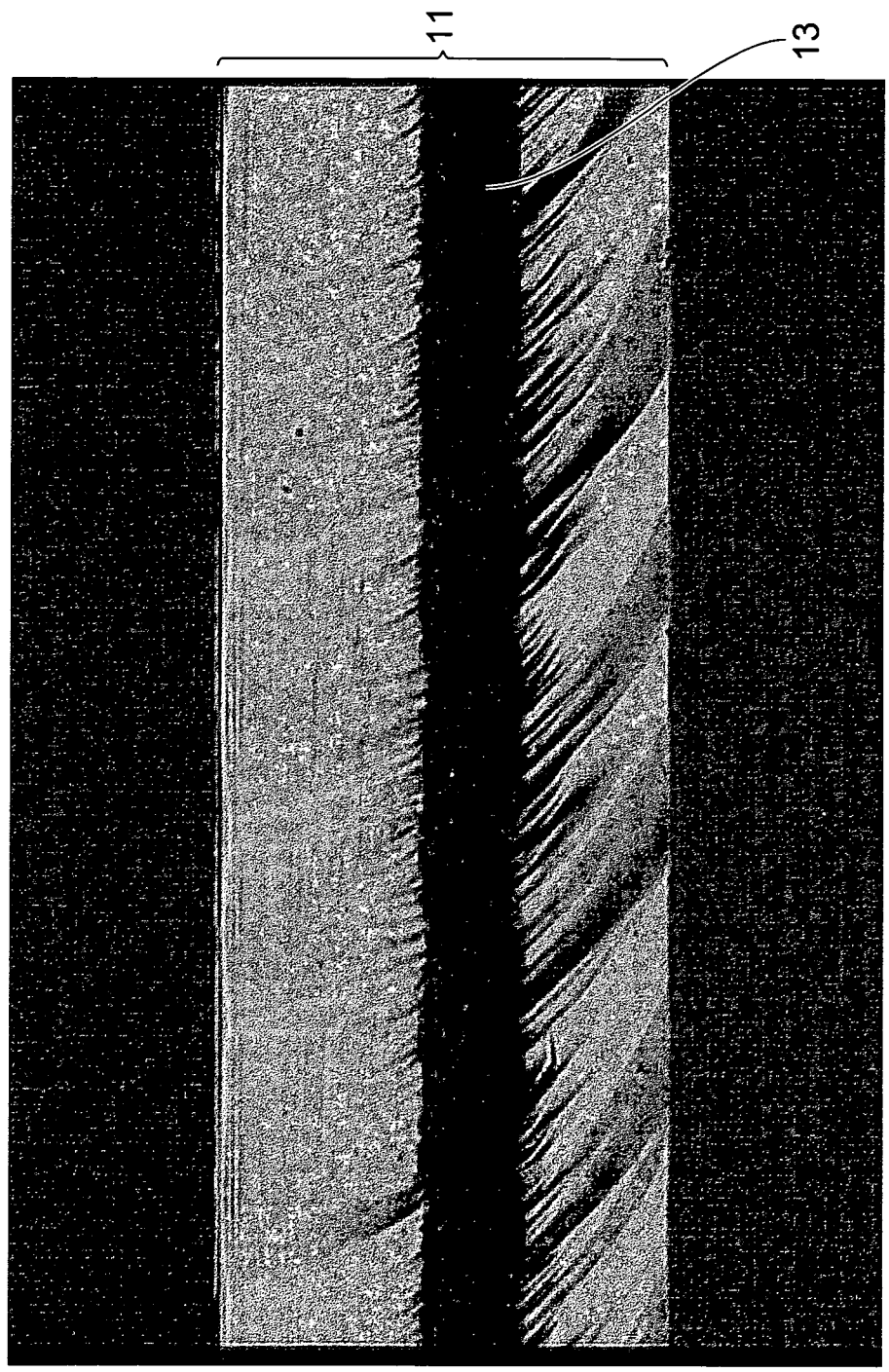
FIG. 12 is a view showing a photograph of a cut section in a part of a silicon wafer cut by the laser processing method in accordance with the embodiment.

FIG. 12 is a view showing a photograph of a cut section in a part of a silicon wafer cut by laser processing under the above-mentioned conditions. A molten processed region 13 is formed within a silicon wafer 11. The size of the molten processed region 13 formed under the above-mentioned conditions is about 100 μm in the thickness direction.

Figure 13:
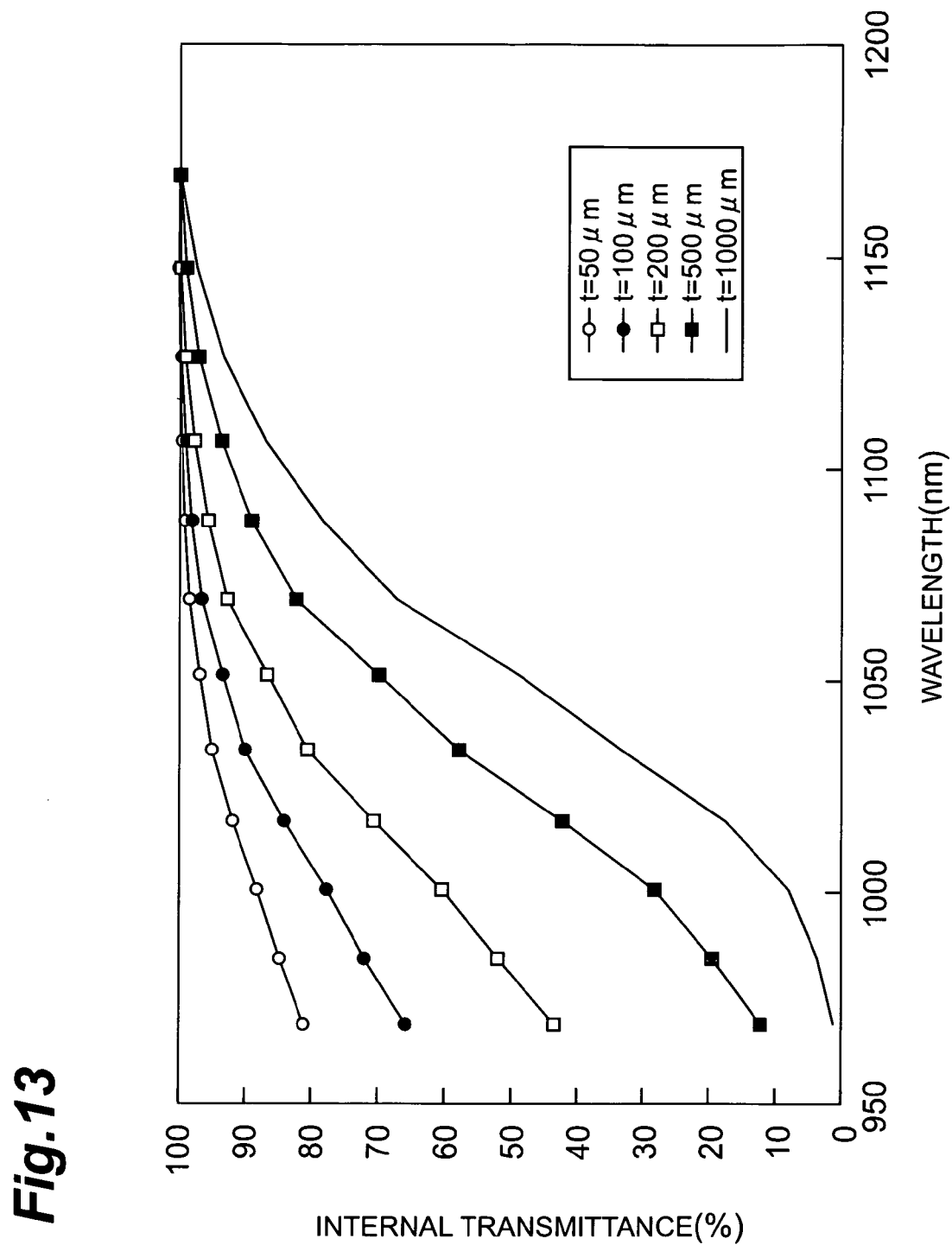
FIG. 13 is a graph showing relationships between the laser light wavelength and the internal transmittance of a silicon substrate in the laser processing method in accordance with the embodiment.

The fact that the molten processed region 13 is formed by multiphoton absorption will now be explained. FIG. 13 is a graph showing relationships between the wavelength of laser light and the transmittance within the silicon substrate. Here, respective reflecting components on the front face side and rear face side of the silicon substrate are eliminated, whereby only the transmittance therewithin is represented. The above-mentioned relationships are shown in the cases where the thickness t of the silicon substrate is 50 μm, 100 μm, 200 μm, 500 μm, and 1000 μm, respectively.

For example, it is seen that laser light is transmitted through the silicon substrate by at least 80% at 1064 nm, where the wavelength of Nd:YAG laser is located, when the silicon substrate has a thickness of 500 μm or less. Since the silicon wafer 11 shown in FIG. 12 has a thickness of 350 μm, the molten processed region 13 due to multiphoton absorption is formed near the center of the silicon wafer, i.e., at a part separated from the front face by 175 μm. The transmittance in this case is 90% or greater with reference to a silicon wafer having a thickness of 200 μm, whereby the laser light is absorbed within the silicon wafer 11 only slightly and is substantially transmitted therethrough. This means that the molten processed region 13 is not formed by laser light absorption within the silicon wafer 11 (i.e., not formed upon usual heating with laser light), but by multiphoton absorption. The forming of a molten processed region by multiphoton absorption is described, for example, in "Processing Characteristic Evaluation of Silicon by Picosecond Pulse Laser", *Preprints of the National Meeting of Japan Welding Society*, No. 66 (April 2000), pp. 72-73.

Here, a fracture is generated in the cross-sectional direction while using a molten processed region as a start point, whereby the silicon wafer is cut when the fracture reaches the front face and rear face of the silicon wafer. The fracture reaching the front face and rear face of the silicon wafer may grow naturally or grow as a force is applied to the silicon wafer. The fracture naturally grows from the starting point region for cutting to the front face and rear face of the silicon wafer in any of the cases where the fracture grows from the molten processed region in a melted state and where the fracture grows from the molten processed region in the process of re-solidifying from the melted state. In any of these cases, the molten processed region is formed only within the silicon wafer. In the cut section after cutting, the molten processed region is formed only therewithin as shown in FIG. 12. When a molten processed region is formed within the object, unnecessary fractures deviating from a line along which the object should be cut are hard to occur at the time of fracturing, which makes it easier to control the fracturing.

(3) Case where the Modified Region is a Refractive Index Change Region

An object to be processed (e.g., glass) is irradiated with laser light while a light-converging point is positioned therewithin under a condition with an electric field intensity of at least $1 \times 10^8$ (W/cm$^2$) at the light-converging point and a pulse width of 1 ns or less. When multiphoton absorption is generated within the object with a very short pulse width, the energy caused by multiphoton absorption is not transformed into thermal energy, so that a permanent structural change such as ionic valence change, crystallization, or polarization orientation is induced within the object, whereby a refractive index change region is formed. The upper limit of electric field intensity is $1 \times 10^{12}$ (W/cm$^2$), for example. The pulse width is preferably 1 ns or less, more preferably 1 ps or less, for example. The forming of a refractive index change region by multiphoton absorption is described, for example, in "Formation of Photoinduced Structure within Glass by Femtosecond Laser Irradiation", *Proceedings of* 42*th Laser Materials Processing Conference* (November 1997), pp. 105-111.

The cases of (1) to (3) are explained as modified regions formed by multiphoton absorption in the foregoing. When a starting point region for cutting is formed as follows in view of the crystal structure of a wafer-like object to be processed, the cleavage property thereof, and the like, the substrate can be cut with a smaller force and a higher accuracy while using the starting point region for cutting as a start point.

Namely, in the case of a substrate made of a monocrystal semiconductor having a diamond structure such as silicon, the starting point region for cutting is preferably formed in a direction along the (111) plane (first cleavage plane) or (110) plane (second cleavage plane). In the case of a substrate made of a III-V family compound semiconductor having a zinc ore type structure such as GaAs, the starting point region for cutting is preferably formed in a direction along the (110) plane. In the case of a substrate having a hexagonal crystal structure such as sapphire ($Al_2O_3$), a starting point region for cutting is preferably formed in a direction along the (1120) plane (A plane) or (1100) plane (M plane) while using the (0001) plane (C plane) as a principal plane.

When the substrate is formed with an orientation flat along a direction to be formed with the starting point region for cutting (e.g., in a direction along the (111) plane in the monocrystal silicon substrate) or a direction orthogonal to the direction to be formed with the starting point region for cutting, the starting point region for cutting extending along the direction to be formed with the starting point region for cutting can be formed in the substrate in an easy and accurate manner with reference to the orientation flat.

Figure 14:
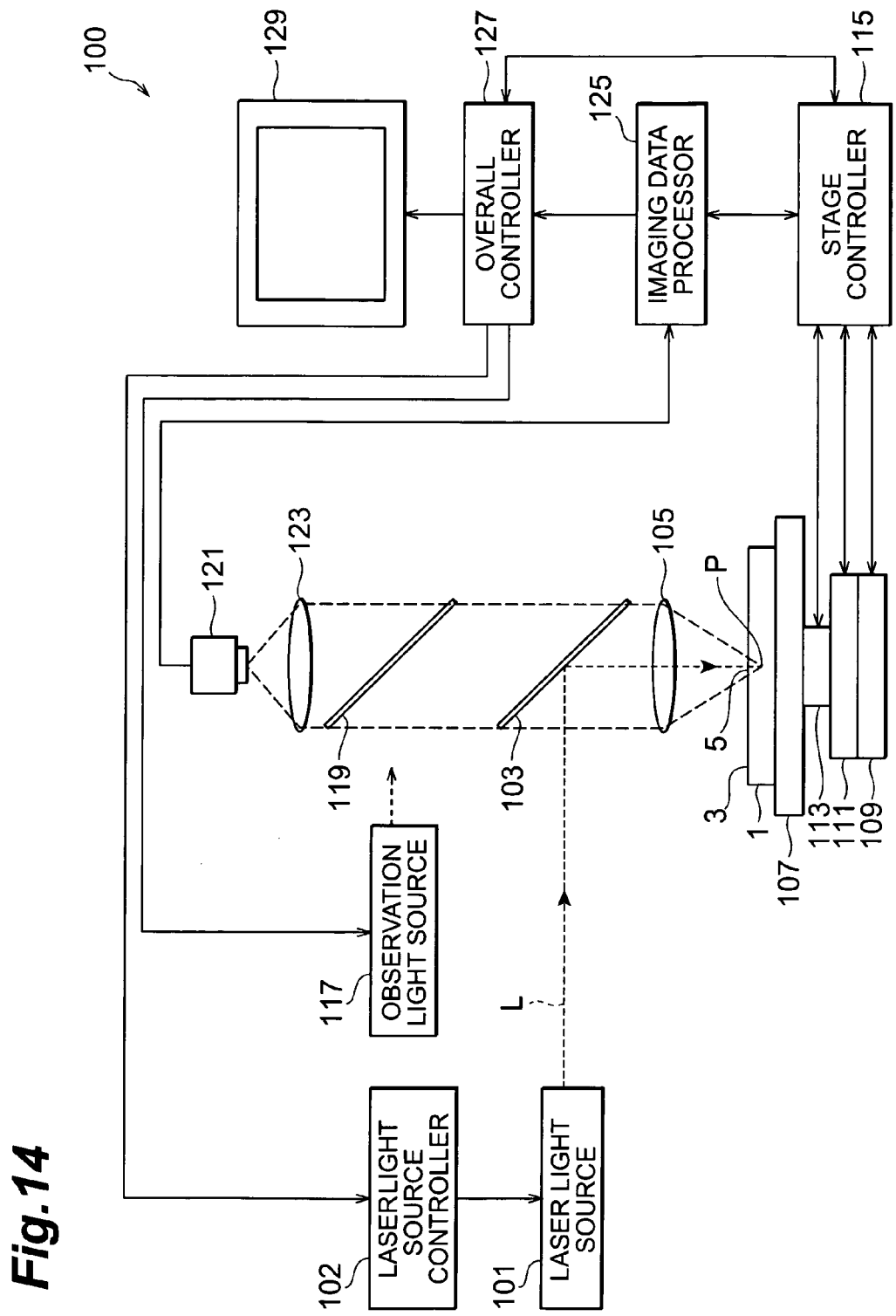
FIG. 14 is a schematic diagram of the laser processing apparatus in accordance with the embodiment.

A laser processing apparatus used in the above-mentioned laser processing method will now be explained with reference to FIG. 14. FIG. 14 is a schematic diagram of the laser processing apparatus 100.

The laser processing apparatus 100 comprises a laser light source 101 for generating laser light L; a laser light source controller 102 for controlling the laser light source 101 so as to regulate the output, pulse width, etc. of laser light L and the like; a dichroic mirror 103, arranged so as to change the orientation of the optical axis of laser light L by 90°, having a function of reflecting the laser light L; a light-converging lens 105 for converging the laser light L reflected by the dichroic mirror 103; a mounting table 107 for mounting an object to be processed 1 irradiated with the laser light L converged by the light-converging lens 105; an X-axis stage 109 for moving the mounting table 107 in the X-axis direction; a Y-axis stage 111 for moving the mounting table 107 in the Y-axis direction orthogonal to the X-axis direction; a Z-axis stage 113 for moving the mounting table 107 in the Z-axis direction orthogonal to the X- and Y-axis directions; and a stage controller 115 for controlling the movement of these three stages 109, 111, 113.

This movement of light-converging point P in X(Y)-axis direction is effected by moving the object 1 in the X(Y)-axis direction by the X(Y)-axis stage 109 (111). The Z-axis direction is a direction orthogonal to the front face 3 of the object 1, and thus becomes the direction of focal depth of laser light L incident on the object 1. Therefore, moving the Z-axis stage 113 in the Z-axis direction can position the light-converging point P of laser light L within the object 1. This can place the light-converging point P at a desirable position such as the substrate, the laminate part on the substrate, or the like in the object 1 when the object 1 has a multilayer structure, for example.

The laser light source 101 is an Nd:YAG laser generating pulse laser light. Known as other kinds of laser usable as the laser light source 101 include Nd:$YVO_4$ laser, Nd:YLF laser, and titanium sapphire laser. Though pulse laser light is used for processing the object 1 in this embodiment, continuous wave laser light may be used as long as it can cause multiphoton absorption.

The laser processing apparatus 100 further comprises an observation light source 117 for generating a visible light beam for irradiating the object 1 mounted on the mounting table 107, and a visible light beam splitter 119 disposed on the same optical axis as that of the dichroic mirror 103 and light-converging lens 105. The dichroic mirror 103 is disposed between the beam splitter 119 and light-converging lens 105. The beam splitter 119 has a function of reflecting about a half of a visual light beam and transmitting the remaining half therethrough, and is arranged so as to change the orientation of the optical axis of the visual light beam by 90°. About a half of the visible light beam generated from the observation light source 117 is reflected by the beam splitter 119, and thus reflected visible light beam is transmitted through the dichroic mirror 103 and light-converging lens 105, so as to illuminate the front face 3 of the object 1 including the line along which the object should be cut 5 and the like. When the object 1 is mounted on the mounting table 107 such that the rear face of the object 1 faces the light-converging lens 105, the "front face" mentioned above becomes the "rear face" as a matter of course.

The laser processing apparatus 100 further comprises an image pickup device 121 and an imaging lens 123 which are disposed on the same optical axis as that of the beam splitter 119, dichroic mirror 103, and light-converging lens 105. An example of the image pickup device 121 is a CCD camera. The reflected light of the visual light beam having illuminated the front face 3 including the line along which the object should be cut 5 and the like is transmitted through the light-converging lens 105, dichroic mirror 103, and beam splitter 119 and forms an image by way of the imaging lens 123, whereas thus formed image is captured by the image pickup device 121, so as to yield imaging data.

The laser processing apparatus 100 further comprises an imaging data processor 125 for inputting the imaging data outputted from the image pickup device 121, an overall controller 127 for controlling the laser processing apparatus 100 as a whole, and a monitor 129. According to the imaging data, the imaging data processor 125 calculates focal point data for positioning the focal point of the visible light generated from the observation light source 117 onto the front face 3 of the object 1. According to the focal point data, the stage controller 115 controls the movement of the Z-axis stage 113, so that the focal point of visible light is positioned on the front face 3 of the object. Hence, the imaging data processor 125 functions as an autofocus unit. Also, according to the imaging data, the imaging data processor 125 calculates image data such as an enlarged image of the front face 3. The image data is sent to the overall controller 127, subjected to various kinds of processing therein, and then sent to the monitor 129. As a consequence, an enlarged image or the like is displayed on the monitor 129.

Data from the stage controller 115, image data from the imaging data processor 125, and the like are fed into the overall controller 127. According to these data as well, the overall controller 127 regulates the laser light source controller 102, observation light source 117, and stage controller 115, thereby controlling the laser processing apparatus 100 as a whole. Thus, the overall controller 127 functions as a computer unit.

Figure 15:
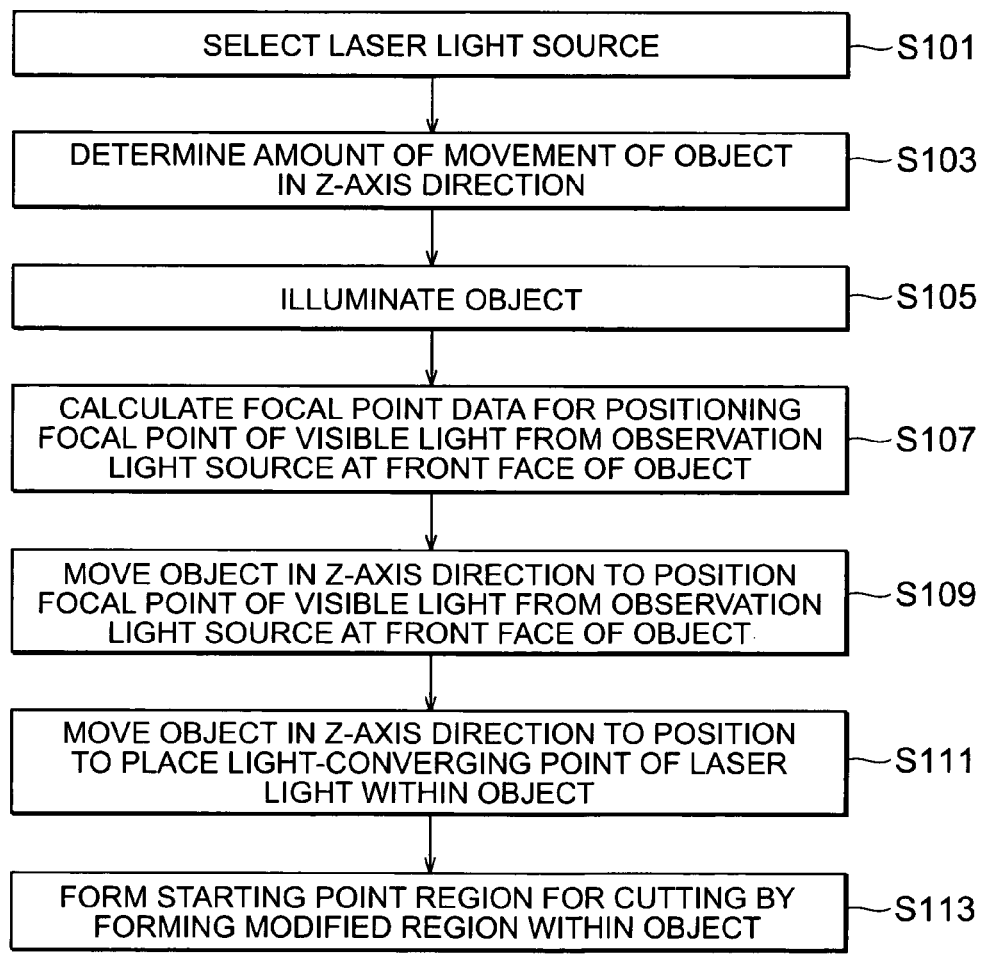
FIG. 15 is a flowchart for explaining the laser processing method in accordance with the embodiment.

The starting point region for cutting forming step in the case using the above-mentioned laser processing apparatus will now be explained with reference to FIGS. 14 and 15. FIG. 15 is a flowchart for explaining the starting point region for cutting forming step.

Light absorption characteristics of the substrate of the object 1 are determined by a spectrophotometer or the like which is not depicted. According to the results of measurement, a laser light source 101 generating laser light L having a wavelength to which the substrate of the object 1 is transparent or exhibits a low absorption is chosen (S101). Subsequently, in view of the thickness and refractive index of the object 1, the amount of movement of the object 1 in the Z-axis direction in the laser processing apparatus 100 is determined (S103). This is an amount of movement of the object 1 in the Z-axis direction with reference to the light-converging point P of laser light L positioned at the rear face of the object 1 in order for the light-converging point P of laser light L to be placed at a desirable position within the object 1. This amount of movement is fed into the overall controller 127.

The object 1 is mounted on the mounting table 107 of the laser processing apparatus 100 such that the rear face of the substrate faces the light-converging lens 105. Subsequently, the thickness of the object 1 is measured. According to the result of measurement of thickness and the refractive index of the object 1, the amount of movement of the object 1 in the Z-axis direction is determined (S103). This is an amount of movement of the object 1 in the Z-axis direction with reference to the light-converging point of laser light L positioned at the front face 3 of the object 1 in order for the light-converging point P of laser light L to be positioned within the object 1. This amount of movement is fed into the overall controller 127.

The objet 1 is mounted on the mounting table 107 of the laser processing apparatus 100. Subsequently, visible light is generated from the observation light source 117, so as to illuminate the front face of the object 1 (S105). The illuminated front face 3 of the object 1 including the line along which the object should be cut 5 is captured by the image pickup device 121. The imaging data captured by the imaging device 121 is sent to the imaging data processor 125. According to the imaging data, the imaging data processor 125 calculates such focal point data that the focal point of visible light from the observation light source 117 is positioned at the front face 3 (S107).

The focal point data is sent to the stage controller 115. According to the focal point data, the stage controller 115 moves the Z-axis stage 113 in the Z-axis direction (S109). As a consequence, the focal point of visible light from the observation light source 117 is positioned at the front face 3 of the object 1. According to the imaging data, the imaging data processor 125 calculates enlarged image data of the front face 3 of the object 1 including the line along which the object should be cut 5. The enlarged image data is sent to the monitor 129 by way of the overall controller 127, whereby an enlarged image of the line along which the object should be cut 5 and its vicinity is displayed on the monitor 129.

Movement amount data determined in step S103 has been fed into the overall controller 127 beforehand, and is sent to the stage controller 115. According to the movement amount data, the stage controller 115 causes the Z-axis stage 113 to move the object 1 in the Z-axis direction to a position where the light-converging point P of laser light L is positioned within the object 1 (S111).

Subsequently, laser light L is generated from the laser light source 101, so as to irradiate the line along which the object should be cut 5 in the front face 3 of the substrate of the object 1. Since the light-converging point P of the laser light L is positioned within the object 1, a modified region is formed only within the object 1. Then, the X-axis stage 109 and Y-axis stage 111 are moved along the line along which the object should be cut 5, such that the modified region formed along the line along which the object should be cut 5 forms a starting point region for cutting within the object 1 along the line along which the object should be cut 5 (S113).

The present invention will now be explained more specifically with reference to Examples.

EXAMPLE 1

Figure 19:
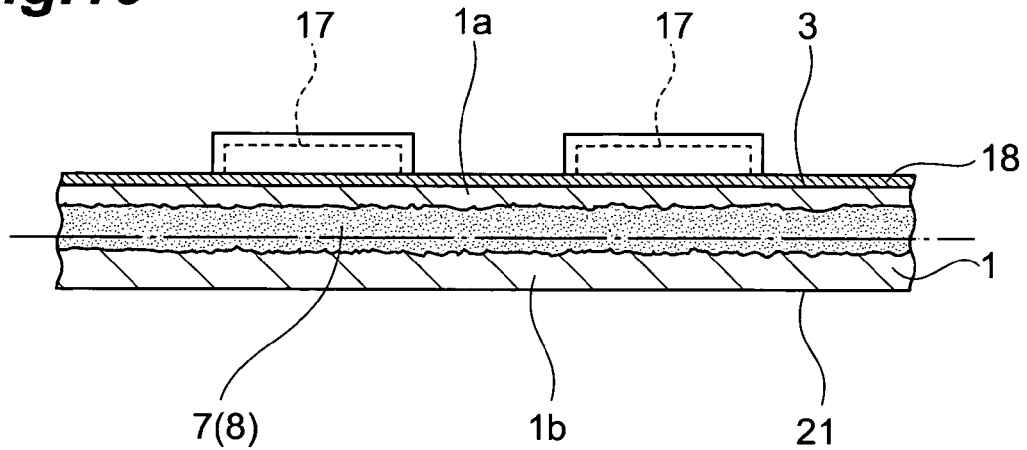
FIG. 19 is a sectional view showing a case where a starting point region for cutting is positioned across a center line in the object to be processed in accordance with Example 1.
Figure 20:
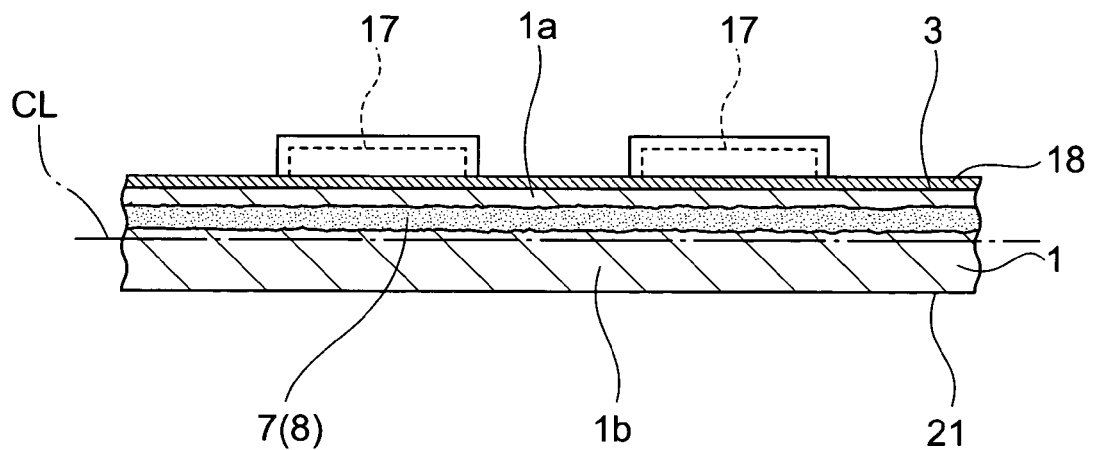
FIG. 20 is a sectional view showing a case where the whole cutting region is positioned on the front face side of the center line in the object to be processed in accordance with Example 1.
Figure 21:
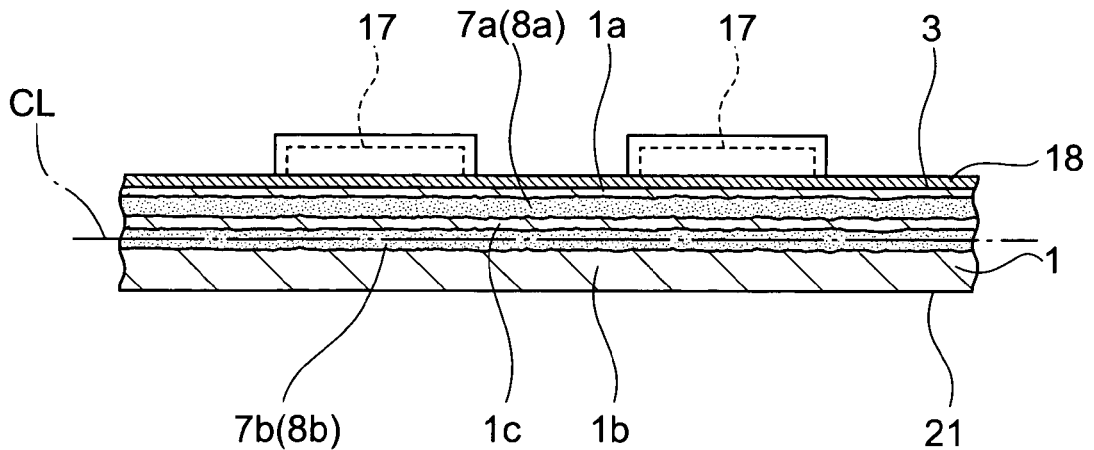
FIG. 21 is a sectional view showing a case where a starting point region for cutting on the rear face side is positioned on the center line whereas a starting point region for cutting on the front face side is positioned between the starting point region for cutting on the rear face side and the front face in the object to be processed in accordance with Example 1.

Example 1 of the method of cutting an object to be processed in accordance with the present invention will be explained. FIGS. 17, 18, and 22 to 24 are partial sectional views of the object to be processed 1 taken along the line XVII-XVII of FIG. 16. FIGS. 19 to 21 are partial sectional views of the object 1 taken along the line XIX-XIX of FIG. 16.

Figure 16:
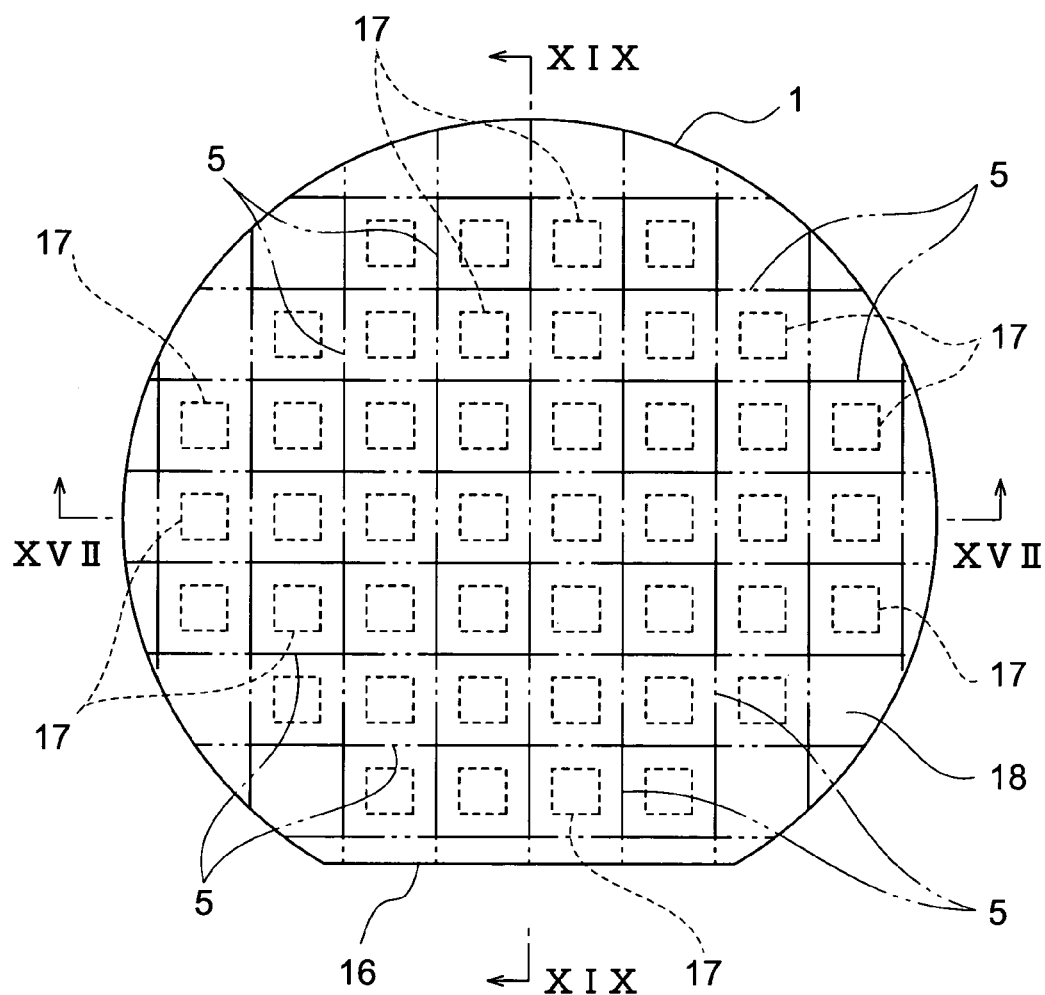
FIG. 16 is a plan view of the object to be processed in accordance with Example 1.
Figure 17:
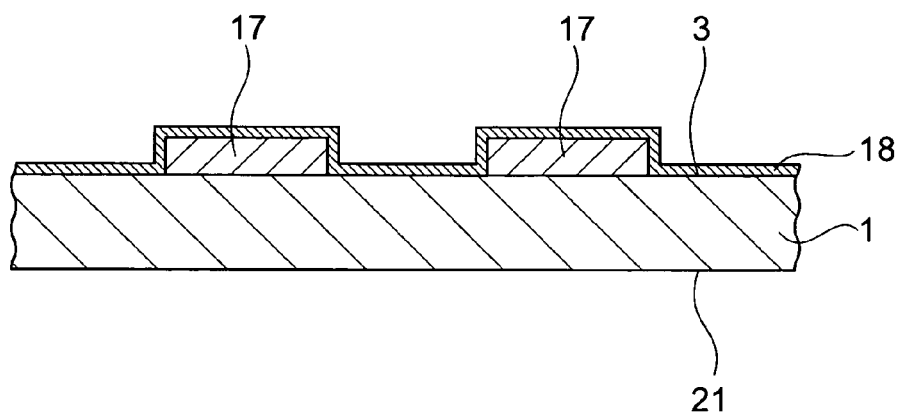
FIG. 17 is a sectional view showing a step of making the object to be processed in accordance with Example 1.

As shown in FIGS. 16 and 17, the front face 3 of the object to be processed 1, which is a silicon wafer, is formed with a plurality of functional devices 17 in a matrix in parallel with an orientation flat 16 of the object 1, whereby the object 1 is produced. Formed on the front face 3 side of the object 1 is an insulating film 18 made of $SiO_2$ or the like, which covers the front face 3 and functional devices 17.

Therefore, the object 1 is a substrate, whereas the functional devices 17 and insulating film 18 constitute a laminate part disposed on the front face of the substrate. Here, the laminate part disposed on the front face of the substrate refers to one deposited on the front face of the substrate, one bonded onto the front face of the substrate, one attached to the front face of the substrate, etc., regardless of whether its material is different from or identical to that of the substrate. The laminate part disposed on the front face of the substrate includes one disposed in close contact with the substrate, one disposed with a gap from the substrate, etc. Examples of the laminate part include semiconductor active layers formed by crystal growth on the substrate, functional devices (which refer to light-receiving devices such as photodiodes and light-emitting devices such as laser diodes, circuit devices formed as a circuit, etc.) formed on the substrate, glass substrates bonded onto other glass substrates, etc. The laminate part also includes one in which a plurality of layers are formed from materials different from each other.

Figure 18:
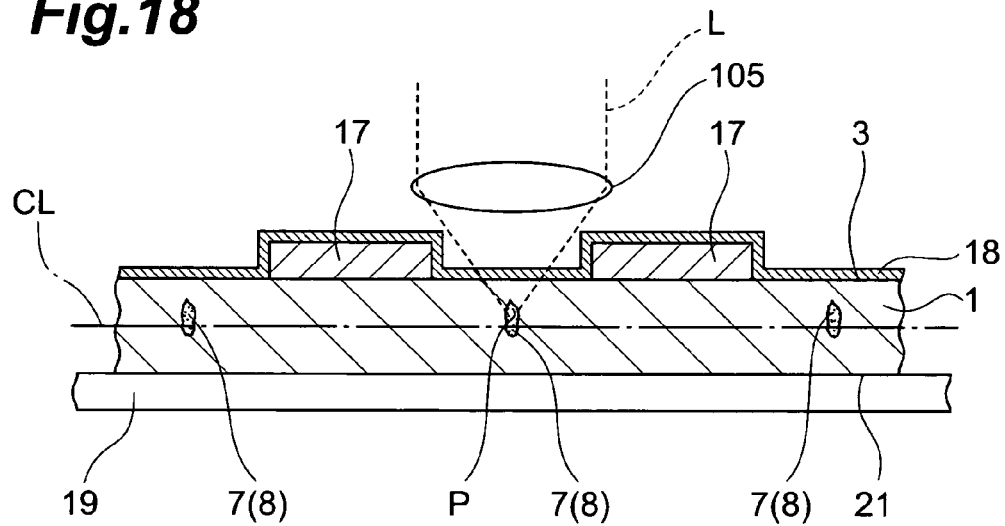
FIG. 18 is a sectional view showing the starting point region for cutting forming step in accordance with Example 1.

Subsequently, as shown in FIG. 18, an expandable expansion film 19 is attached to the rear face 21 of the object 1, and then the object 1 is mounted on the mounting table 107 of the above-mentioned laser processing apparatus 100, for example, such that the front face 3 side of the object 1 faces the light-converging lens 105. Thereafter, the object 1 is irradiated with laser light L while its light-converging point P is positioned within the object 1, so as to form a modified region 7 within the object 1, and cause the modified region 7 to form a starting point region for cutting 8 along a line along which the object should be cut 5 inside by a predetermined distance from the front face 3 (laser light incident face) of the object 1 (starting point region for cutting forming step). Since the object to be processed 1 is a silicon wafer, a molten processed region is formed as the modified region 7.

In the starting point region for cutting forming step, as shown in FIG. 19, the starting point region for cutting 8 deviated from a center line L passing the center position of the object 1 in the thickness direction toward the front face (one end face) 3 is formed along the line along which the object should be cut 5. In the case where the object 1, which is a silicon wafer, has a thickness of 100 μm, by way of example, the width in the thickness direction (hereinafter simply be referred to as "width") of an unmodified region 1a positioned on the front face 3 side of the starting point region for cutting 8 is 20 μm, the width of the starting point region for cutting 8 (i.e., modified region 7) is 40 μm, and the width of an unmodified region 1b positioned on the rear face 21 side of the starting point region for cutting 8 is 40 μm. When the thickness of the object is 50 μm, the width of the unmodified region 1a is 10 μm, the width of the starting point region for cutting 8 is 20 μm, and the width of the unmodified region 1b is 20 μm.

In addition to such a "case where the starting point region for cutting 8 is positioned across the center line CL", a mode of "the starting point region for cutting 8 deviated from the center line CL toward the front face 3" include the following two cases, for example. Namely, there are "a case where the whole starting point region for cutting 8 is positioned on the front face 3 side of the center line CL" as shown in FIG. 20, and "a case where two starting point regions for cutting 8a, 8b are formed on the front face 3 side and the rear face 21 side, such that the starting point region for cutting 8b on the rear face 21 side is positioned on the center line CL, whereas the starting point region for cutting 8a on the front face 3 side is positioned between the starting point region for cutting 8b and the front face 3".

In the case of FIG. 20, for example, the thickness of the object 1 is 100 μm, the width of the unmodified region 1a is 30 μm, the width of the starting point region for cutting 8 is 10 μm, and the width of the unmodified region 1b is 60 μm. In the case of FIG. 21, the thickness of the object 1 is 200 μm, the width of the unmodified region 1a is 20 μm, the width of the starting point region for cutting 8a is 40 μm, the width of the unmodified region 1c positioned between the starting point regions for cutting 8a, 8b is 20 μm, the width of the starting point region for cutting 8b is 40 μm, and the width of the unmodified region 1b is 80 μm.

In the starting point region for cutting forming step, the line along which the object should be cut 5 is scanned with the laser light L. The line along which the object should be cut 5 is set like a grid passing between functional devices 17, 17 adjacent each other (see FIG. 16). The positional data of the line along which the object should be cut 5 with respect to the object 1 is stored into a storage section in the overall controller 127 in the laser processing apparatus 100, for example.

Figure 22:
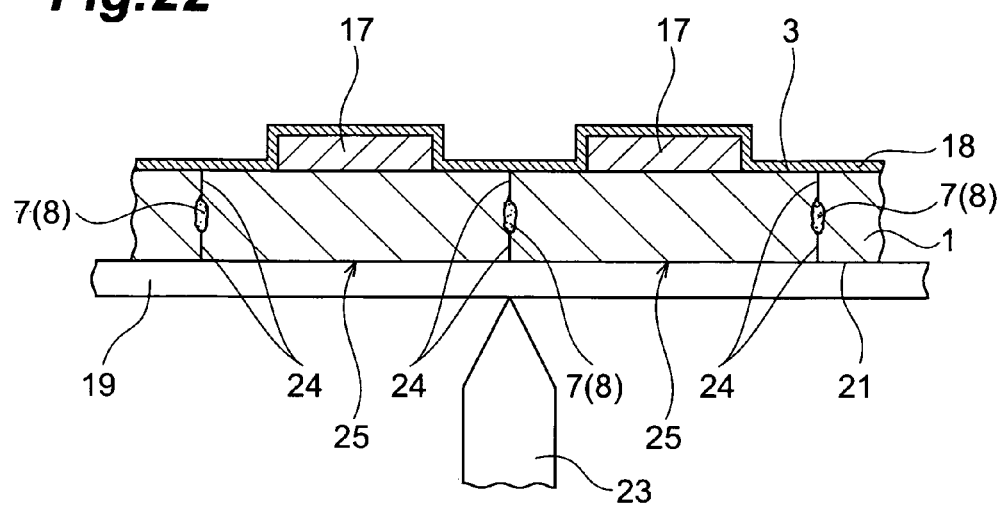
FIG. 22 is a sectional view showing the pressing step in accordance with Example 1.

After the starting point region for cutting is formed, as shown in FIG. 22, a knife edge 23 as pressing means is pressed against the object 1 from the rear face (other end face) 21 side thereof by way of the expansion film 19, so as to generate a fracture 24 from the starting point region for cutting 8 acting as a start point, and cause the fracture 24 to reach the front face 3 and rear face 21 of the objet 1 (pressing step). As a consequence, the object 1 is divided into individual semiconductor chips 25 each having one functional device 17.

In the pressing step, the positional data of the line along which the object should be cut 5 stored in the storage section is read out, and the knife edge 23 is controlled according to the positional data, so as to be pressed against the object 1 along the line along which the object should be cut 5, whereby the object 1 is pressed along the line along which the object should be cut 5.

Thus, the positional data of the line along which the object should be cut with respect to the object 1 is stored in the starting point region for cutting forming step, and the object 1 is pressed against the line along which the object should be cut 5 according to the positional data in the pressing step, whereby the pressing force can act easily and accurately on the starting point region for cutting 8 formed within the substrate 1. Then, pressing the object 1 along the line along which the object should be cut 5 can accurately cut the object 1 into each functional device 17 while substantially eliminating the action of the pressing force on the functional devices 17.

When the modified region 7 is positioned near the front face 3 of the object 1 as in the pressing step shown in FIG. 22, the knife edge 23 is pressed against the rear face 21 of the object 1 along the starting point region for cutting (part to cut) 8 formed by the modified region 7, so as to break and cut the object 1. This is because a large tensile stress among bending stresses generated upon pressing the knife edge 23 acts on the modified region 7, whereby the object 1 can be cut with a relatively small force.

Figure 23:
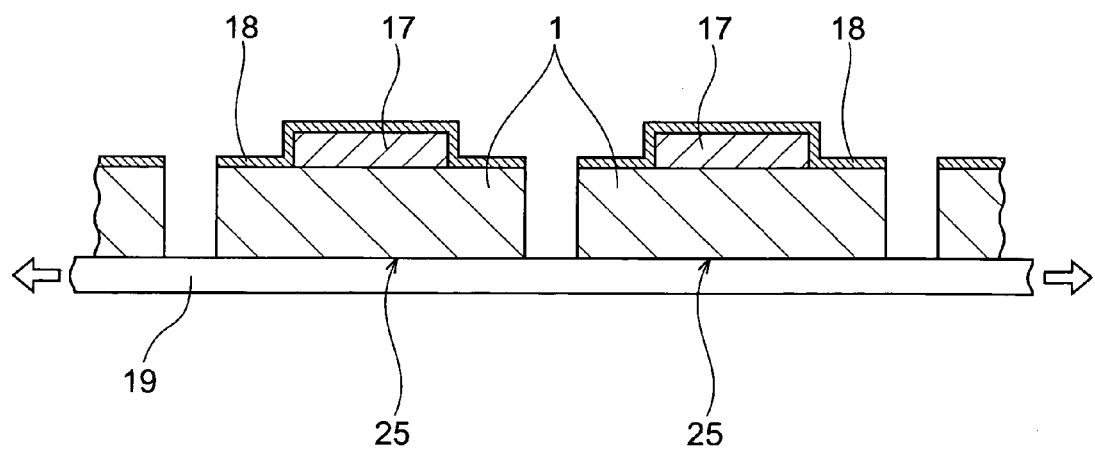
FIG. 23 is a sectional view showing a step of expanding an expansion sheet in accordance with Example 1.

After the object 1 is pressed, the expansion film 19 is expanded outward, so as to separate the semiconductor chips 25 from each other as shown in FIG. 23. Separating the semiconductor chips 25 from each other by using the expansion film 19 as such can make it easier to pick up the semiconductor chips 25.

In the method of cutting an object to be processed in accordance with Example 1, as explained in the foregoing, the modified region 7 formed by multiphoton absorption forms the region to cut 8 within the object 1 along the line along which the object should be cut 5. Here, the multiphoton absorption occurs locally within the object 1, so that the laser light L is hardly absorbed by the front face 3 and rear face 21 of the object 1, whereby the front face 3 and rear face 21 can be prevented from melting upon irradiation with the laser light L. Since the region to cut 8 is formed so as to shift from the center line CL of the object 1 toward the front face 3, when the object 1 is pressed by the knife edge 23 from the rear face 21 side, the fracture can be generated in the object 1 from the starting point region for cutting 8 acting as a start point by a smaller pressing force than in the case where the starting point region for cutting 8 is formed on the center line CL. This can accurately cut the object 1 along the line along which the object should be cut 5 while preventing unnecessary fractures deviating from the line along which the object should be cut 5 from occurring.

Figure 24:
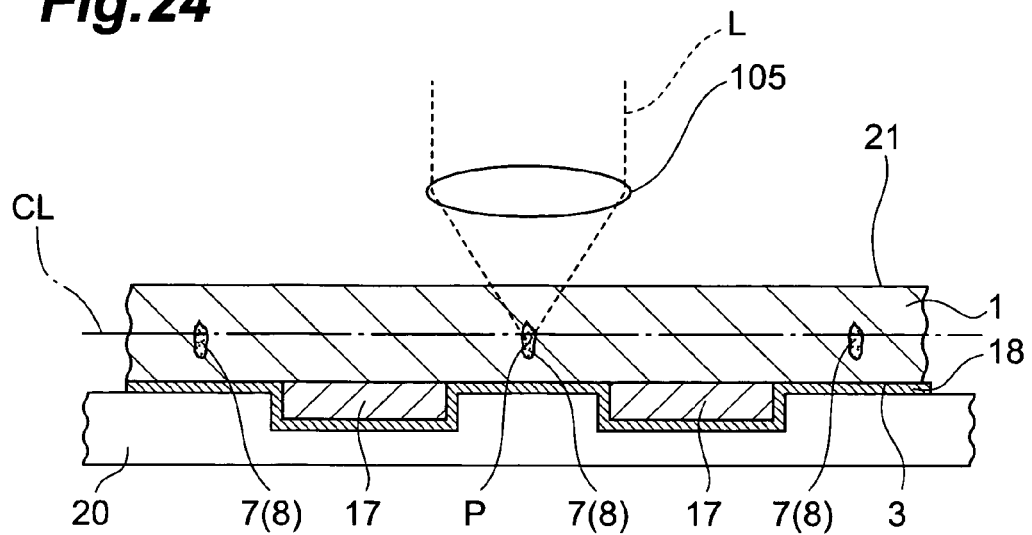
FIG. 24 is a sectional view showing a case where the object to be processed is irradiated with laser light from the rear face side thereof in the starting point region for cutting forming step in accordance with Example 1.

In the case where a metal film for electrostatic prevention or the like is formed between adjacent functional devices 17, 17 (i.e., on the line along which the object should be cut 5) in the object 1 shown in FIGS. 16 and 17, so that the object 1 is hard to be irradiated with the laser light L from the front face 3 side, the starting point region for cutting 8 can be formed as follows. Namely, as shown in FIG. 24, a protection film 20 for protecting the functional devices 17 is attached to the front face 3 side of the object 1 before attaching the expansion film 19, and the object 1 is mounted on the mounting table 107 of the above-mentioned laser processing apparatus 100, for example, such that the rear face 21 side of the object 1 faces the light-converging lens 105. Then, the object 1 is irradiated with the laser light L while the light-converging point P is positioned therewithin, so as to form a modified region 7 within the object 1, and cause the modified region 7 to form a starting point region for cutting 8 shifted from the center line CL to the front face 3 side of the object 1 along the line along which the object should be cut 5.

EXAMPLE 2

Figure 25:
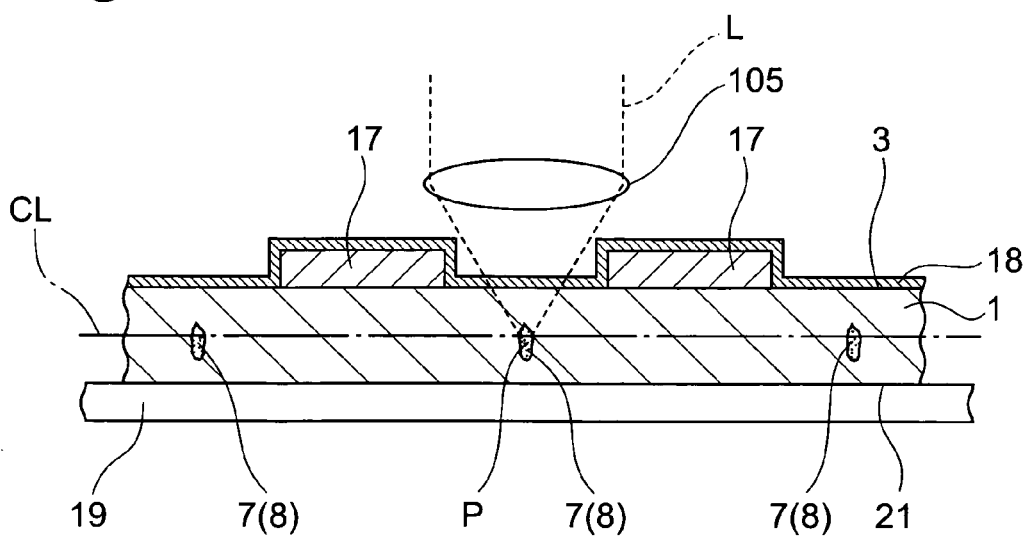
FIG. 25 is a sectional view showing the starting point region for cutting forming step in accordance with Example 2.
Figure 26:
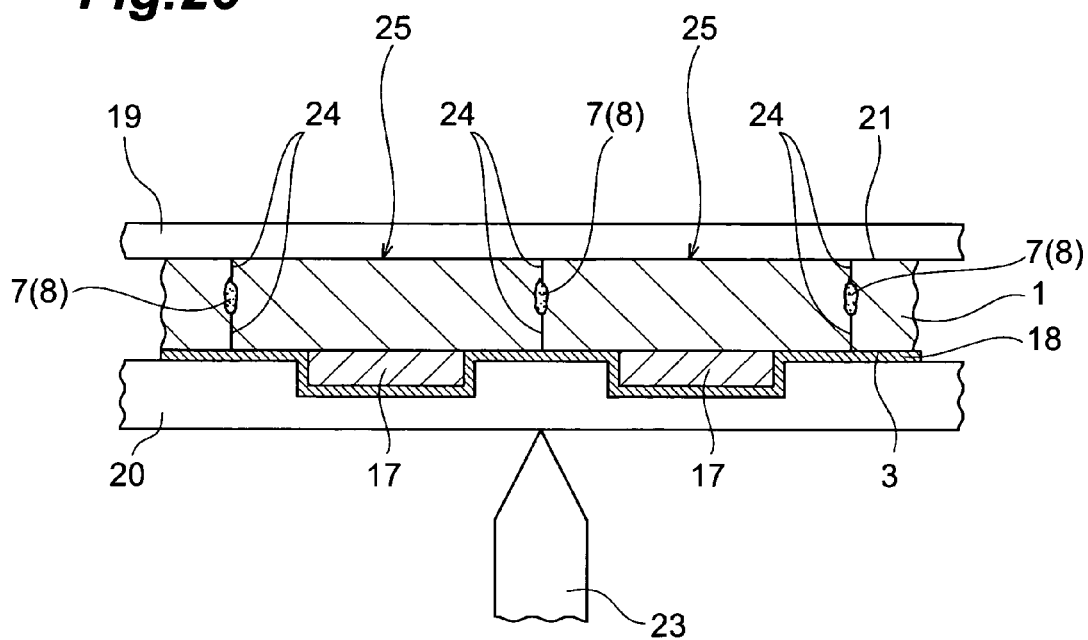
FIG. 26 is a sectional view showing the pressing step in accordance with Example 2.
Figure 27:
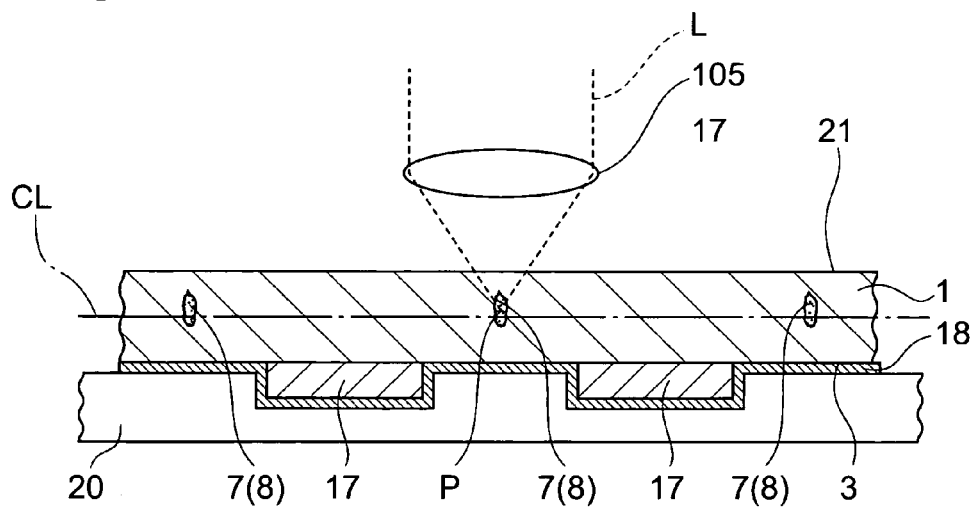
FIG. 27 is a sectional view showing a case where the object to be processed is irradiated with laser light from the rear face side thereof in the starting point region for cutting forming step in accordance with Example 2.

Example 2 of the method of cutting an object to be processed in accordance with the present invention will now be explained. FIGS. 25 to 27 are partial sectional views of the object 1 taken along the line XVII-XVII of FIG. 16.

As in Example 1 mentioned above, the object to be processed 1 shown in FIGS. 16 and 17 is produced, and a starting point region for cutting 8 is formed along a line along which the object should be cut 5 inside by a predetermined distance from the front face 3 (laser light incident face) of the object 1 (starting point region for cutting forming step). In the starting point region for cutting forming step in Example 2, the starting point region for cutting 8 shifted from the center line CL passing the center position of the object 1 in the thickness direction toward the rear face (one end face) 21 is formed along the line along which the object should be cut 5 as shown in FIG. 25.

Subsequently, as shown in FIG. 26, a protective film 20 is attached to the front face 3 side of the object to be processed 1, so as to cover the functional devices 17. Then, the knife edge 23 is pressed against the object 1 from the front face (other face) 3 side of the object 1 by way of the expansion film 19, so as to generate a fracture 24 from the starting point region for cutting 8 acting as a start point, and cause the fracture 24 to reach the front face 3 and rear face 21 of the object 1 (pressing step). As a consequence, the object 1 is divided into individual semiconductor chips 25 each having one functional device 17.

In the pressing step, as in Example 1, the positional data of the line along which the object should be cut 5 stored in the storage section is read out, and the knife edge 23 is controlled according to the positional data, so as to be pressed against the object 1 along the line along which the object should be cut 5, whereby the object 1 is pressed along the line along which the object should be cut 5.

When the modified region 7 is positioned near the rear face 21 of the object 1 as in the pressing step shown in FIG. 26, the knife edge 23 is pressed against the front face 3 of the objet 1 along the starting point region for cutting (part to cut) 8 formed by the modified region 7, so as to break and cut the object 1. This is because a large tensile stress among bending stresses generated upon pressing the knife edge 23 acts on the modified region 7, whereby the object 1 can be cut with a relatively small force.

Subsequently, the protective film 20 is peeled off from the object 1, and the expansion film 19 is expanded outward, so as to separate the semiconductor chips 25 from each other as in Example 1, whereby the semiconductor chips 25 are picked up.

In the method of cutting an object to be processed in accordance with Example 2, as explained in the foregoing, the starting point region for cutting 8 is formed so as to shift from the center line CL of the object 1 toward the rear face 21. Therefore, when the knife edge 23 presses the object 1 from the front face 3 side, the fracture 24 can be generated in the object 1 from the starting point region for cutting 8 acting as a start point by a smaller pressing force than in the case where the starting point region for cutting 8 is formed on the center line CL. This can accurately cut the object 1 along the line along which the object should be cut 5 while preventing unnecessary fractures deviating from the line along which the object should be cut 5 from occurring. Also, since the object 1 can be cut with a small pressing force, the influence on the functional devices 17 when the objet 1 is pressed from the front face 3 side can be alleviated.

In the case where a metal film for electrostatic prevention or the like is formed between adjacent functional devices 17, 17 in the object 1, so that the object 1 is hard to be irradiated with the laser light L from the front face 3 side, the object 1 is irradiated with the laser light L while the light-converging point P is positioned therewithin, so as to form a modified region 7 within the object 1, and cause the modified region 7 to form a starting point region for cutting 8 shifted from the center line CL toward the rear face 21 of the object 1 along the line along which the object should be cut 5 by a method similar to that of Example 1 mentioned above as shown in FIG. 27.

The present invention is not limited to the above-mentioned embodiment. For example, though the front face 3 side or rear face 21 side of the object 1 is pressed along the line along which the object should be cut 5 in the pressing step of Examples 1 and 2, the object 1 as a whole on the front face 3 side or rear face 21 side may be pressed with a roller or the like. Since the fracture 24 is generated from the starting point region for cutting 8 acting as a start point, the object 1 can efficiently be cut along the line along which the object should be cut 5 in this case as well. Also, parts (e.g., respective parts of the functional devices 17) of the object 1 on the front face 3 side or rear face 21 side may successively be pressed with a pressure needle or the like. Means for pressing the object 1 along the line along which the object should be cut 5 includes not only the above-mentioned knife edge 23, but also a cutter.

INDUSTRIAL APPLICABILITY

As explained in the foregoing, the method of cutting an object to be processed in accordance with the present invention can accurately cut the object to be processed.

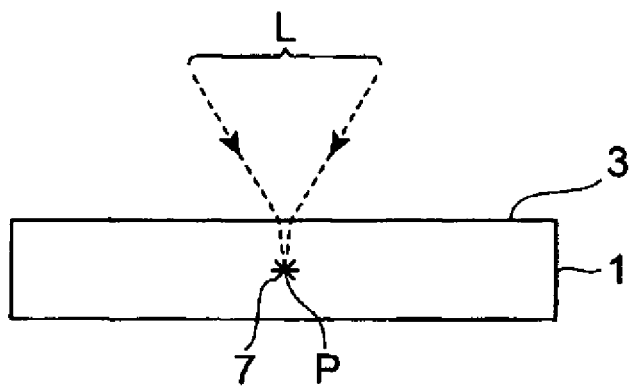

The invention claimed is:

1. A method of cutting an object to be processed, the method comprising:
    a starting point region for cutting forming step of irradiating a wafer-like object to be processed with laser light while positioning a light-converging point within the object under a condition with a peak power density of at least $1\times10^8$ (W/cm$^2$) at the light-converging point and a pulse width of 1 μs or less, so as to form a modified region including a molten processed region within the object, and causing the modified region to form a starting point region for cutting, deviated from a center position of the object in a thickness direction thereof toward one end face of the object, along a line along which the object should be cut in the object; and
    a pressing step of pressing the object from the other end face side of the object.

2. A method of cutting an object to be processed, the method comprising:
    a starting point region for cuffing forming step of irradiating a wafer-like object to be processed which is made of a semiconductor material with laser light while positioning a light-converging point within the object under a condition with a peak power density of at least $1\times10^8$ (W/cm$^2$) at the light-converging point and a pulse width of 1 μis or less, so as to form a modified region within the object, and causing the modified region to form a starting point region for cutting, deviated from a center position of the object in a thickness direction thereof toward one end face of the object, along a line along which the object should be cut in the object; and
    a pressing step of pressing the object from the other end face side of the object.

3. A method of manufacturing a semiconductor device formed using a method of cutting an object to be processed, the manufacturing method comprising:
    a starting point region for cutting forming step of irradiating a wafer-like object to be processed with laser light, the object comprising semiconductor material and having a surface formed with at least one semiconductor device, while positioning a light-converging point within the object under a condition with a peak power density of at least $1\times10^8$ (W/cm$^2$) at the light-converging point and a pulse width of 1 μs or less, so as to form a modified region including a molten processed region within the object, with the modified region forming a starting point region serving as a starting point for cutting, deviated from a center position of the object in a thickness direction thereof toward one end face of the object, the object along a line along which the object is to be cut; and
    a pressing step of pressing the object from the other end face side of the object, with such pressing thereby resulting in cutting the object along the line along which the object is to be cut in order to provide at least one manufactured semiconductor device.

* * * * *

UNITED STATES PATENT AND TRADEMARK OFFICE
CERTIFICATE OF CORRECTION

PATENT NO.           : 7,749,867 B2
APPLICATION NO.      : 10/507340
DATED                : July 6, 2010
INVENTOR(S)          : Fumitsugu Fukuyo et al.

Page 1 of 1

It is certified that error appears in the above-identified patent and that said Letters Patent is hereby corrected as shown below:

Delete current Claim 2 entirely and add following Claim 2 in its place:

2. A method of cutting an object to be processed, the method comprising:
    a starting point region for cutting forming step of irradiating a wafer-like object to be processed which is made of a semiconductor material with laser light while positioning a light-converging point within the object, so as to form a molten processed region within the object, and causing the molten processed region to form a starting point region for cutting, deviated from a center position of the object in a thickness direction thereof toward one end face of the object, along a line along which the object should be cut in the object; and
    a pressing step of pressing the object from the other end face side of the object.

After Claim 3, last line, add following Claim 4:

4. A method of manufacturing a semiconductor device formed using a method of cutting an object to be processed, the manufacturing method comprising:
    a starting point region for cutting forming step of irradiating a wafer-like object to be processed with laser light, the object comprising a semiconductor material and having a surface formed with at least one semiconductor device, while positioning a light-converging point within the object, so as to form a molten processed region within the object, with the molten processed region forming a starting point region serving as a starting point for cutting, deviated from a center position of the object in a thickness direction thereof toward one end face of the object, the object along a line along which the object is to be cut; and
    a pressing step of pressing the object from the other end face side of the object, with such pressing thereby resulting in cutting the object along the line along which the object is to be cut in order to provide at least one manufactured semiconductor device.

Signed and Sealed this
Seventeenth Day of May, 2011

David J. Kappos
*Director of the United States Patent and Trademark Office*

UNITED STATES PATENT AND TRADEMARK OFFICE
CERTIFICATE OF CORRECTION

PATENT NO. : 7,749,867 B2
APPLICATION NO. : 10/507340
DATED : July 6, 2010
INVENTOR(S) : Fumitsugu Fukuyo et al.

It is certified that error appears in the above-identified patent and that said Letters Patent is hereby corrected as shown below:

Delete the title page and substitute therefore the attached title page showing the corrected number of claims in patent.

Column 16, lines 27-42,
Delete current Claim 2 entirely and add following Claim 2 in its place:

2. A method of cutting an object to be processed, the method comprising:
    a starting point region for cutting forming step of irradiating a wafer-like object to be processed which is made of a semiconductor material with laser light while positioning a light-converging point within the object, so as to form a molten processed region within the object, and causing the molten processed region to form a starting point region for cutting, deviated from a center position of the object in a thickness direction thereof toward one end face of the object, along a line along which the object should be cut in the object; and
    a pressing step of pressing the object from the other end face side of the object.

After Claim 3, Column 16, line 66, add following Claim 4:

4. A method of manufacturing a semiconductor device formed using a method of cutting an object to be processed, the manufacturing method comprising:
    a starting point region for cutting forming step of irradiating a wafer-like object to be processed with laser light, the object comprising a semiconductor material and having a surface formed with at least one semiconductor device, while positioning a light-converging point within the object, so as to form a molten processed region within the object, with the molten processed region forming a starting point point region serving as a starting point for cutting, deviated from a center position of the object in a thickness direction thereof toward one end face of the object, the object along a line along which the object is to be cut; and This certificate supersedes the Certificate of Correction issued May 17, 2011.

Signed and Sealed this
Twenty-first Day of June, 2011

David J. Kappos
*Director of the United States Patent and Trademark Office* a pressing step of pressing the object from the other end face side of the object, with such pressing thereby resulting in cutting the object along the line along which the object is to be cut in order to provide at least one manufactured semiconductor device.

CERTIFICATE OF CORRECTION (continued)

(12) United States Patent
Fukuyo et al.

(10) Patent No.: US 7,749,867 B2
(45) Date of Patent: *Jul. 6, 2010

(54) METHOD OF CUTTING PROCESSED OBJECT

(75) Inventors: Fumitsugu Fukuyo, Hamamatsu (JP); Kenshi Fukumitsu, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 964 days.

This patent is subject to a terminal disclaimer.

(21) Appl. No.: 10/507,340

(22) PCT Filed: Mar. 11, 2003

(86) PCT No.: PCT/JP03/02867

§ 371 (c)(1),
(2), (4) Date: Jun. 17, 2005

(87) PCT Pub. No.: WO03/076119

PCT Pub. Date: Sep. 18, 2003

(65) Prior Publication Data

US 2006/0011593 A1    Jan. 19, 2006

(30) Foreign Application Priority Data

Mar. 12, 2002  (JP) ................................ 2002-067372

(51) Int. Cl.
*H01L 21/301* (2006.01)

(52) U.S. Cl. .............. 438/463; 438/462; 438/460; 438/796; 438/795

(58) Field of Classification Search ......... 438/460–463, 438/795–798

See application file for complete search history.

(56) References Cited

U.S. PATENT DOCUMENTS 3,448,510 A    6/1969  Bippus et al.

(Continued)

FOREIGN PATENT DOCUMENTS

DE    196 46 332 A1    5.1998

(Continued)

OTHER PUBLICATIONS

F. Fukuyo, "The Stealth Dicing Technologies and Their Applications," Journal of Japan Laser Processing Society, vol. 12, No. 1, Feb. 2005, pp. 17-23, with English translation.

(Continued)

*Primary Examiner*—Dung A. Le
(74) *Attorney, Agent, or Firm*—Drinker Biddle & Reath LLP

(57) ABSTRACT

A method of cutting an object which can accurately cut the object is provided. An object to be processed 1 such as a silicon wafer is irradiated with laser light L while a light-converging point P is positioned therewithin, so as to form a modified region 7 due to multiphoton absorption within the object 1, and cause the modified region 7 to form a starting point region for cutting 8 shifted from the center line CL of the thickness of the object 1 toward the front face 3 of the object 1 along a line along which the object should be cut. Subsequently, the object 1 is pressed from the rear face 21 side thereof. This can generate a fracture from the starting point region for cutting 8 acting as a start point, thereby accurately cutting the object 1 along the line along which the object should be cut.

4 Claims, 21 Drawing Sheets